(12) United States Patent
Tanoue et al.

(10) Patent No.: US 12,745,588 B2
(45) Date of Patent: Sep. 22, 2026

(54) PROCESSING METHOD AND PROCESSING SYSTEM

(71) Applicant: Tokyo Electron Limited, Tokyo (JP)

(72) Inventors: Hayato Tanoue, Kumamoto (JP); Yohei Yamashita, Kumamoto (JP); Yasutaka Mizomoto, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 379 days.

(21) Appl. No.: 18/683,792

(22) PCT Filed: Jul. 27, 2022

(86) PCT No.: PCT/JP2022/029027
§ 371 (c)(1),
(2) Date: Feb. 15, 2024

(87) PCT Pub. No.: WO2023/021952
PCT Pub. Date: Feb. 23, 2023

(65) Prior Publication Data

US 2026/0143995 A1 May 21, 2026

(30) Foreign Application Priority Data

Aug. 16, 2021 (JP) ................................ 2021-132199
Dec. 8, 2021 (JP) ................................ 2021-199502

(51) Int. Cl.
*H10P 72/00* (2026.01)
*B23K 26/0622* (2014.01)
(Continued)

(52) U.S. Cl.
CPC ...... *H10P 72/0428* (2026.01); *B23K 26/0622* (2015.10); *B23K 26/53* (2015.10); *H10P 72/0602* (2026.01); *B23K 2101/40* (2018.08)

(58) Field of Classification Search
CPC ............ H10P 72/0428; H10P 72/0602; B23K 26/0622; B23K 26/53; B23K 2101/40
See application file for complete search history.

(56) References Cited

U.S. PATENT DOCUMENTS

2011/0039356 A1* 2/2011 Ando ..................... B32B 38/10
257/E21.53
2021/0039203 A1 2/2021 Tanoue
(Continued)

FOREIGN PATENT DOCUMENTS

JP 2021-068869 A 4/2021
JP 2022515871 A * 2/2022 .......... H10P 90/1914
(Continued)

OTHER PUBLICATIONS

International Search Report of PCT/JP2022/029027 dated Oct. 11, 2022.

*Primary Examiner* — Matthew E Warren
(74) *Attorney, Agent, or Firm* — Shih IP Law Group, PLLC.

(57) ABSTRACT

A processing method of processing a combined substrate in which a first substrate and a second substrate are bonded to each other includes acquiring layer information of the combined substrate; forming a non-bonding region in which bonding strength between the first substrate and the second substrate is reduced, by radiating laser light in a pulse shape to a laser absorption film formed at an interface between the first substrate and the second substrate; and separating the first substrate from the second substrate. In the forming of the non-bonding region, a temperature difference between a first temperature in a laser radiation direct region including one light-converging point of the laser light and a second temperature in a laser radiation peripheral region is changed based on at least one of the acquired layer information or a
(Continued)

position of the one light-converging point in the combined substrate in a radial direction.

37 Claims, 18 Drawing Sheets

(51) Int. Cl.
*B23K 26/53* (2014.01)
*B23K 101/40* (2006.01)

(56) References Cited

U.S. PATENT DOCUMENTS

| | | | | |
|---|---|---|---|---|
| 2023/0023577 | A1 | 1/2023 | Yamashita | |
| 2024/0071765 | A1 * | 2/2024 | Tanoue | H10P 34/42 |
| 2024/0082957 | A1 * | 3/2024 | Tanoue | H10P 34/42 |
| 2024/0312804 | A1 * | 9/2024 | Tanoue | H10P 34/42 |

FOREIGN PATENT DOCUMENTS

| | | | | | |
|---|---|---|---|---|---|
| KR | 20210072392 | A | * | 6/2021 | B32B 27/24 |
| KR | 20230065161 | A | * | 5/2023 | B23K 26/083 |
| WO | WO-2004031811 | A2 | * | 4/2004 | C09B 69/008 |
| WO | WO-2013126927 | A2 | * | 8/2013 | B23K 26/50 |
| WO | 2019176589 | A1 | | 9/2019 | |
| WO | WO-2020017599 | A1 | * | 1/2020 | H10P 95/11 |
| WO | 2021131711 | A1 | | 7/2021 | |

* cited by examiner

We Wa Wb We
Dw
Fw
Fs
Ds
W
T
S
Sa Sb

W
Dw
Fw
Fs
Ds
S
We
Ae
L1
L2
L3
M1
M2
B

Pulse Pitch (Q)

Pulse Energy

| 100kHz | 14 μm | 12 μm |
|---|---|---|
| 120 μJ | × | × |
| 100 μJ | × | × |
| 80 μJ | × | × |

Pulse Energy

| 50kHz | 14 μm | 12 μm |
|---|---|---|
| 120 μJ | ○ | ○ |
| 100 μJ | ○ | ○ |
| 80 μJ | ○ | ○ |

114
112
111
100c
110
Air
L2
W
Dw
Fw
Fs
Ds
S
R2
R1

W
Dw
Fw
Fs
Ds
S
L2
Ae

W
Dw
Fw
Fs
Ds
S
Ae
B

PROCESSING METHOD AND PROCESSING SYSTEM

CROSS-REFERENCE TO RELATED APPLICATIONS

This Application is a U.S. national phase application under 35 U.S.C. § 371 of PCT Application No. PCT/JP2022/029027 filed on Jul. 27, 2022, which claims the benefit of Japanese Patent Application No. 2021-132199 filed on Aug. 16, 2021, and Japanese Patent Application No. 2021-199502 filed on Dec. 8, 2021, the entire disclosures of which are incorporated herein by reference.

TECHNICAL FIELD

The various aspects and embodiments described herein pertain generally to a processing method and a processing system.

BACKGROUND

Patent Document 1 describes a substrate processing system equipped with a modification layer forming apparatus configured to form a modification layer within a first substrate along a boundary between a central portion of the first substrate and a peripheral portion thereof as a target of removal in a combined substrate in which the first substrate and a second substrate are bonded to each other, and a periphery removing apparatus configured to remove the peripheral portion of the first substrate starting from the modification layer.

Patent Document 1: International Publication No. 2019/176589

SUMMARY

In an exemplary embodiment, a processing method of processing a combined substrate in which a first substrate and a second substrate are bonded to each other includes acquiring layer information of the combined substrate; forming a non-bonding region in which bonding strength between the first substrate and the second substrate is reduced, by radiating laser light in a pulse shape to a laser absorption film formed at an interface between the first substrate and the second substrate; and separating the first substrate from the second substrate. In the forming of the non-bonding region, a temperature difference between a first temperature in a laser radiation direct region including one light-converging point of the laser light radiated in the pulse shape and a second temperature in a laser radiation peripheral region formed between the one light-converging point and another light-converging point to which the laser light is radiated after the one light-converging point is changed based on at least one of the acquired layer information or a position of the one light-converging point in the combined substrate in a radial direction.

DETAILED DESCRIPTION

Figures 1, 2:
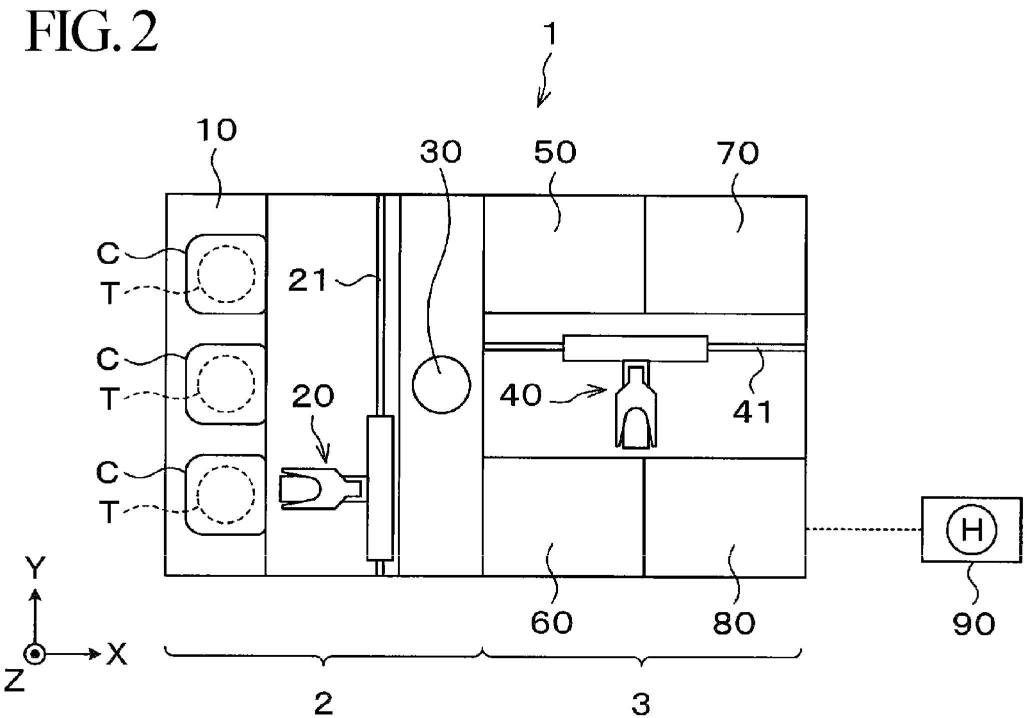
FIG. 1 is a side view illustrating an example of a structure of a combined wafer according to an exemplary embodiment.
FIG. 2 is a plan view illustrating a schematic configuration of a wafer processing system according to the exemplary embodiment.

In a manufacturing process for a semiconductor device, in a combined substrate in which a first substrate (a silicon substrate such as a semiconductor) having a plurality of devices such as electronic circuits formed on a surface thereof and a second substrate are bonded to each other, removal of a peripheral portion of the first substrate, so-called edge trimming may be performed.

The edge trimming of the first substrate is performed by using a substrate processing system described in Patent Document 1, for example. That is, a modification layer is formed by radiating laser light to the inside of the first substrate, and the peripheral portion is removed from the first substrate by using the modification layer as a starting point. Further, according to the substrate processing system described in Patent Document 1, a modification surface and a separation surface are formed by radiating laser light to an interface where the first substrate and the second substrate are bonded, as an attempt to reduce bonding strength between the first substrate and the second substrate at the peripheral portion to thereby appropriately remove the peripheral portion.

However, at the peripheral portion of the first substrate, which is the target of removal in the edge trimming, the bonding strength between the first and second substrates may not be properly reduced due to various factors such as a thickness and a structure of a film formed at the interface between the first and second substrates, for example. Specifically, to reduce the bonding strength between the first substrate and the second substrate, laser light is radiated to and absorbed into an absorption film formed at the interface, thereby generating a stress to cause separation at the interface between the first and second substrates. However, when there is a change in the thickness and the structure of the absorption film between respective combined substrates processed in the substrate processing system, or within the surface of the combined substrate processed in the substrate processing system, the amount of the laser light absorbed by the absorption film changes as a result, which may raises an occasion when the bonding strength between the first substrate and the second substrate cannot be appropriately reduced.

However, through intensive research, the present inventors have found out that the stress generated at the interface to reduce the bonding strength between the first substrate and the second substrate depends on a temperature of the substrate at the time when the laser light is radiated to the interface. In other words, by controlling the temperature of the substrate to which the laser light is radiated, the present inventors have found out a way to reduce the bonding strength between the first and second substrates to thereby more appropriately remove the peripheral portion of the first substrate.

The technique according to the present disclosure has been made based on the above-stated observations, and enables appropriate removal of a part or the whole of the first substrate in the combined substrate in which the first substrate and the second substrate are bonded to each other. Hereinafter, a wafer processing system and a wafer processing method according to an exemplary embodiment will be described with reference to the accompanying drawings. In the present specification and the drawings, parts having substantially the same functions and configurations will be assigned same reference numerals, and redundant description thereof will be omitted.

In a wafer processing system 1 to be described later according to the present exemplary embodiment, a processing is performed on a combined wafer T as a combined substrate in which a first wafer W as a first substrate and a second wafer S as a second substrate are bonded to each other, as shown in FIG. 1. Specifically, as an example, in the combined wafer T in which the first wafer W and the second wafer S are bonded, a peripheral portion We, which is a part of the first wafer W, is removed. Hereinafter, in the first wafer W, a surface to be bonded to the second wafer S is referred to as front surface Wa, and a surface opposite to the front surface Wa is referred to as rear surface Wb. Likewise, in the second wafer S, a surface to be bonded to the first wafer W is referred to as front surface Sa, and a surface opposite to the front surface Sa is referred to as rear surface Sb.

The first wafer W is, for example, a semiconductor wafer such as a silicon substrate, and has a device layer Dw including a plurality of devices formed on the front surface Wa thereof. Further, a laser absorption film Fw is further formed in the device layer Dw, and the first wafer W is bonded to the second wafer S with the laser absorption film Fw therebetween. By way of example, an oxide film (a THOX film, a $SiO_2$ film, or a TEOS film), a SIC film, a SiCN film, or an adhesive may be used as the laser absorption film Fw. Further, the peripheral portion We of the first wafer W is chamfered, and the thickness of the peripheral portion We decreases toward a leading end thereof on a cross section thereof. Furthermore, the peripheral portion We is a portion to be removed in edge trimming to be described later, and is in the range of, e.g., 0.5 mm to 3 mm from an outer end of the first wafer W in a radial direction.

For example, the second wafer S has a device layer Ds and a bonding film Fs formed on the front surface Sa thereof, and is bonded to the first wafer W with the bonding film Fs therebetween. Further, a peripheral portion of the second wafer S is chamfered. In addition, the second wafer S does not need to be a device wafer in which the device layer Ds is formed, and may be a support wafer configured to support the first wafer W. In this case, the second wafer S functions as a protection member configured to protect the device layer of the first wafer W.

Furthermore, although the first wafer W is bonded to the second wafer S with the laser absorption film Fw therebetween in the shown example, a bonding film configured to reduce the bonding strength for the second wafer S may be formed on the front surface of the first wafer W, and this bonding film may be used as the laser absorption film.

As depicted in FIG. 2, the wafer processing system 1 has a configuration in which a carry-in/out station 2 and a processing station 3 are connected as one body. In the carry-in/out station 2, a cassette C capable of accommodating a plurality of combined wafers T therein is carried to/from the outside, for example. The processing station 3 is equipped with various kinds of processing apparatuses each configured to perform a required processing on the combined wafer T.

The carry-in/out station 2 is equipped with a cassette placing table 10 configured to place thereon the cassette C capable of accommodating therein the plurality of combined wafers T. Further, a wafer transfer device 20 is provided adjacent to the cassette placing table 10 on the positive X-axis side of the cassette placing table 10. The wafer transfer device 20 is configured to be moved on a transfer path 21 extending in the Y-axis direction to transfer the combined wafer T between the cassette C of the cassette placing table 10 and a transition device 30 to be described later.

In the carry-in/out station 2, the transition device 30 configured to deliver the combined wafer T to/from the processing station 3 is disposed on the positive X-axis side of the wafer transfer device 20 to be adjacent to the wafer transfer device 20.

The processing station 3 incorporates therein a wafer transfer device 40, an interface modifying apparatus 50, an internal modifying apparatus 60, a periphery removing apparatus 70, and a cleaning apparatus 80.

The wafer transfer device 40 is provided on the positive X-axis side of the transition device 30. The wafer transfer device 40 is configured to be movable on a transfer path 41 extending in the X-axis direction, and is configured to transfer the combined wafer T to/from the transition device 30 of the carry-in/out station 2, the interface modifying apparatus 50, the internal modifying apparatus 60, the periphery removing apparatus 70, and the cleaning apparatus 80.

The interface modifying apparatus 50 is configured to radiate laser light (laser light for interface such as, but not limited to, $CO_2$ laser) to the laser absorption film Fw formed at the interface between the first wafer W and the second wafer S to form a non-bonding region Ae in which the bonding strength between the first wafer W and the second wafer S is reduced.

Figure 3:
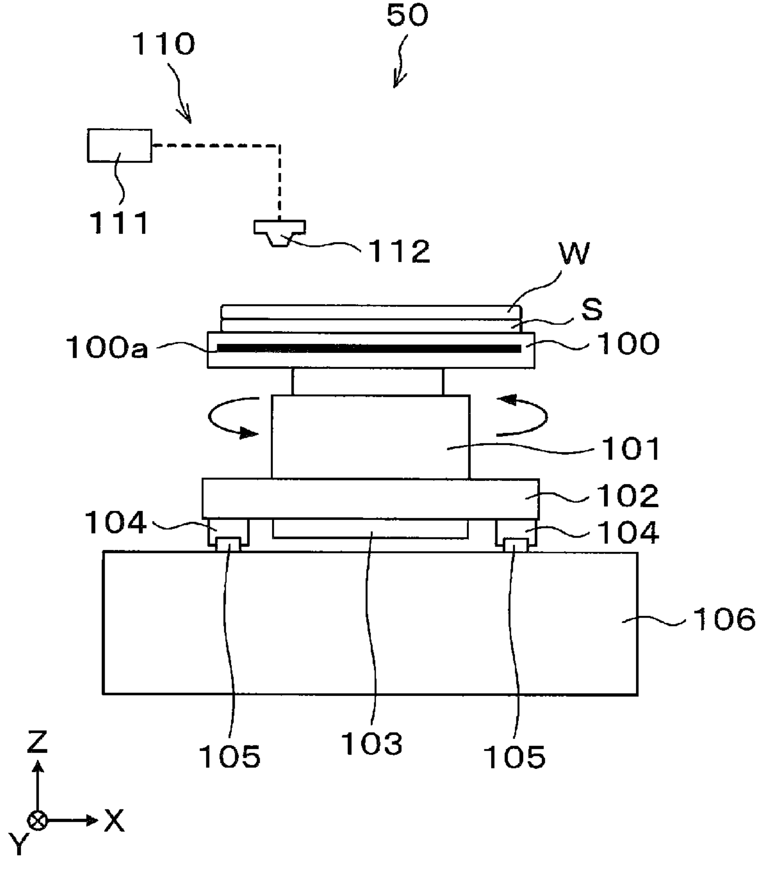
FIG. 3 is a side view illustrating a schematic configuration of an interface modifying apparatus.

As depicted in FIG. 3, the interface modifying apparatus 50 has a chuck 100 configured to hold the combined wafer T on a top surface thereof. The chuck 100 is configured to attract and hold the rear surface Sb of the second wafer S.

The chuck 100 is supported on a slider table 102 with an air bearing 101 therebetween. A rotating mechanism 103 is provided on a bottom surface of the slider table 102. The rotating mechanism 103 incorporates therein, for example, a motor as a driving source. The chuck 100 is configured to be rotatable around a θ axis (vertical axis) by the rotating mechanism 103 with the air bearing 101 therebetween. The slider table 102 is configured to be movable by a horizontally moving mechanism 104, which is provided on the bottom surface thereof, along a rail 105 elongated in the Y-axis direction. Further, although not particularly limited, a driving source of the horizontally moving mechanism 104 may be, for example, a linear motor.

A cooling mechanism **100*a* configured to cool the combined wafer T held by the chuck 100 is provided inside the chuck 100. A configuration of the cooling mechanism 100*a*** is not particularly limited as long as it is capable of appropriately cooling the combined wafer T (particularly, a vicinity of a portion of the combine wafer T to which the laser light for interface is radiated). For example, a Peltier element may be used.

A laser radiation system 110 is provided above the chuck 100. The laser radiation system 110 has a laser head 111 and a lens 112. The lens 112 may be configured to be movable up and down by an elevating mechanism (not shown).

The laser head 111 has a non-illustrated laser oscillator configured to oscillate laser light in a pulse shape. That is, the laser light radiated from the laser radiation system 110 to the combined wafer T held by the chuck 100 is a so-called pulse laser, and its power is repeated between zero (0) and a maximum value. Further, in the present exemplary embodiment, the laser light is $CO_2$ laser light, and the $CO_2$ laser light has a wavelength of, e.g., 8.9 μm to 11 μm. Additionally, the laser head 111 may have other devices of the laser oscillator, such as an amplifier.

The lens 112 is a cylindrical member, and is configured to radiate the laser light to the combined wafer T held by the chuck 100. The laser light emitted from the laser radiation system 110 penetrates the first wafer W to be radiated to and absorbed by the laser absorption film Fw.

Further, although the chuck 100 is configured to be rotatable relative to the laser head 111 and movable in the horizontal direction by the rotating mechanism 103 and the horizontally moving mechanism 104 in the shown example, the laser head 111 may be configured to be rotatable relative to the chuck 100 and movable in the horizontal direction. In addition, both the chuck 100 and the laser head 111 may be configured to be rotatable relative to each other and movable in the horizontal direction.

Moreover, the laser head 111 may further include a non-illustrated spatial light modulator. The spatial light modulator is configured to modulate laser light and output the modulated laser light. Specifically, the spatial light modulator is capable of adjusting the focal position and the phase of the laser light, thus capable of adjusting the shape and the number (number of branches) of the radiated laser light. At this time, in the laser light that is radiated while being branched, an output and a shape can be adjusted for each branch. By way of non-limiting example, a LCOS (Liquid Crystal Silicon) may be adopted as the spatial light modulator.

The internal modifying apparatus 60 is configured to radiate laser light (laser light for inside, such as YAG laser) to the inside of the first wafer W to form a peripheral modification layer M1 serving as a starting point for separation of the peripheral portion We and a split modification layer M2 as a starting point for breaking the peripheral portion We into smaller pieces. A configuration of the internal modifying apparatus 60 is not particularly limited. As an example, the internal modifying apparatus 60 is equipped with a chuck configured to hold the combined wafer T on a top surface thereof, a rotating mechanism configured to rotate the chuck and the combined wafer (the first wafer W) relative to each other, a moving mechanism configured to move the chuck and the combined wafer (the first wafer W) relative to each other in the horizontal direction, and a laser radiator (laser head) configured to radiate the laser light for inside to the inside of the first wafer W held by the chuck.

The periphery removing apparatus 70 as a separating apparatus is configured to remove the peripheral portion We of the first wafer W starting from the peripheral modification layer M1 formed in the internal modifying apparatus 60, that is, to perform the edge trimming. Any of various methods for the edge trimming may be selected. As one example, in the periphery removing apparatus 70, a blade formed in, for example, a wedge shape may be inserted between the first wafer W and the second wafer S. Alternatively, an impact may be applied to the peripheral portion We by spraying an air blow or a water jet toward the peripheral portion We.

The cleaning apparatus 80 is configured to perform a cleaning processing on the first wafer W and the second wafer S after being subjected to the edge trimming in the periphery removing apparatus 70 to remove particles on these wafers. Any of various cleaning methods may be adopted.

The above-described wafer processing system 1 is equipped with a control device 90. The control device 90 is, for example, a computer, and has a program storage (not shown). The program storage stores therein a program for controlling the processing of the combined wafer T in the wafer processing system 1. The program storage also stores therein a program for implementing a wafer processing to be described later in the wafer processing system 1 by controlling operations of a driving system such as the transfer devices and the various types of processing apparatuses described above. In addition, the programs may have been recorded in a computer-readable recording medium H, and may be installed from the recording medium H to the control device 90. The recording medium H may be transitory or non-transitory.

Now, a wafer processing performed by using the wafer processing system 1 configured as described above will be explained. In the present exemplary embodiment, the first wafer W and the second wafer S are previously bonded to form the combined wafer T.

First, the cassette C accommodating the plurality of combined wafers T is placed on the cassette placing table 10 of the carry-in/out station 2.

Figures 4A, 4B, 4C, 4D:
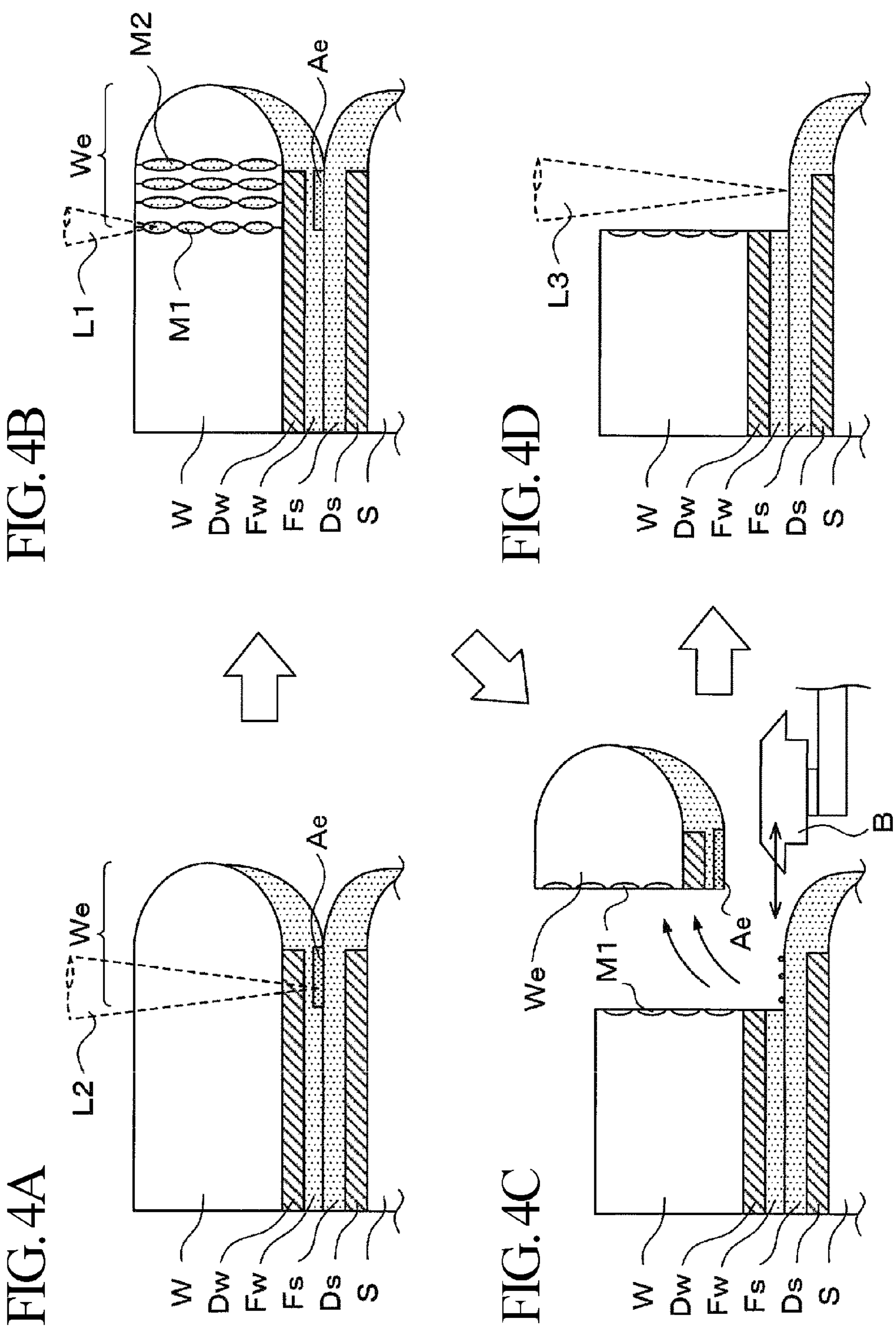
FIG. 4A to FIG. 4D are explanatory diagrams illustrating main processes of a wafer processing in the wafer processing system.

Then, the combined wafer T in the cassette C is taken out by the wafer transfer device 20, and transferred to the interface modifying apparatus 50 via the transition device 30 and the wafer transfer device 40. In the interface modifying apparatus 50, while rotating the combined wafer T (first wafer W) and moving it in the horizontal direction, laser light L2 for interface (hereinafter referred to as interface laser light L2) is radiated in a pulse shape to the interface (more specifically, the above-described laser absorption film Fw formed at the interface) between the first wafer W and the second wafer S at the peripheral portion We. As a result, as depicted in FIG. 4A, separation occurs at the interface between the first wafer W and the second wafer S.

Figure 5:
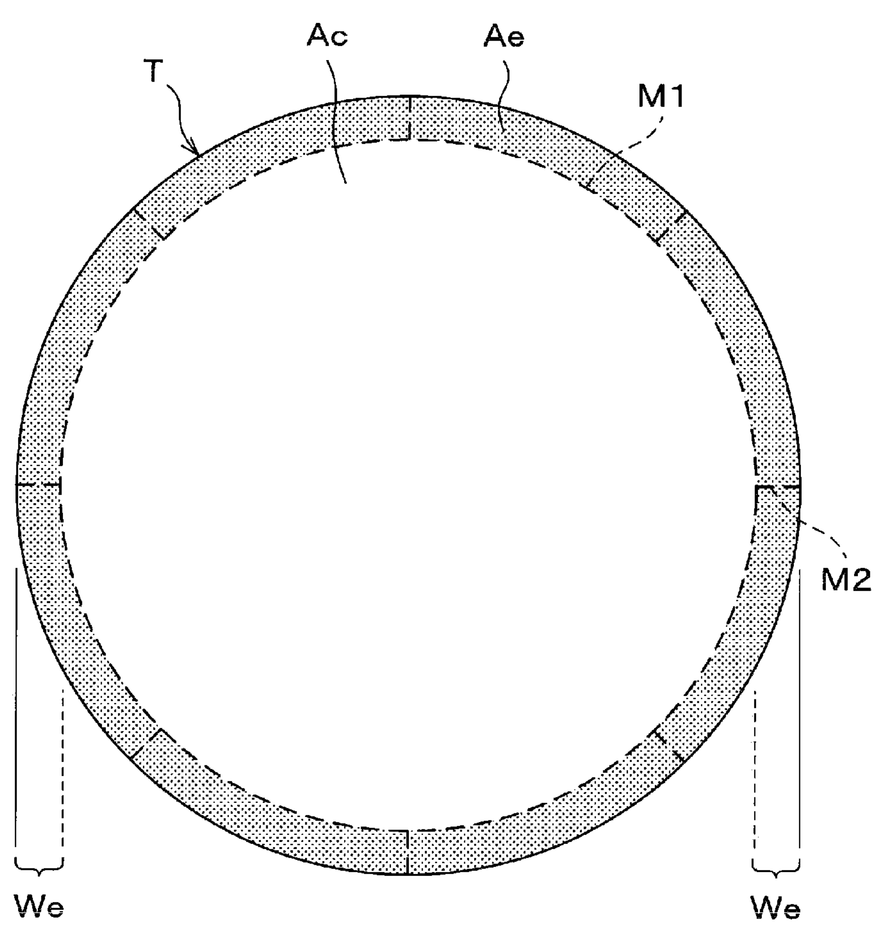
FIG. 5 is a cross sectional view illustrating a state of the combined wafer after a non-bonding region is formed.

In the interface modifying apparatus 50, since the separation occurs at the interface between the first wafer W and the second wafer S in this way, there is formed the non-bonding region Ae where the bonding strength between the first wafer W and the second wafer S is reduced. As a result, the non-bonding region Ae of an annular shape is formed at the interface between the first wafer W and the second wafer S, and, also, a bonding region Ac in which the first wafer W and the second wafer S are bonded to each other is formed radially inside the non-bonding region Ae, as illustrated in FIG. 5. In the edge trimming to be described later, the peripheral portion We of the first wafer W as a target of removal is removed. Since the non-bonding region Ae is provided as described above, the removal of the peripheral We can be carried out appropriately.

A detailed method of forming the non-bonding region Ae in the interface modifying apparatus 50 will be discussed later.

The combined wafer T in which the non-bonding region Ae is formed is then transferred to the internal modifying apparatus 60. In the internal modifying apparatus 60, by radiating laser light L1 for inside to the inside of the first wafer W, a peripheral modification layer M1 and a split modification layer M2 are formed, as shown in FIG. 4B. The peripheral modification layer M1 serves as a starting point when removing the peripheral portion We in the edge trimming to be described later. The split modification layer M2 serves as a starting point for breaking the peripheral portion We to be removed into smaller pieces. In the drawings to be referred to in the following description, illustration of the split modification layer M2 may be omitted in order to avoid complication of the illustration.

The combined wafer T in which the peripheral modification layer M1 and the split modification layer M2 are formed within the first wafer W is then transferred to the periphery removing apparatus 70 by the wafer transfer device 40. In the periphery removing apparatus 70, the removal of the peripheral portion We of the first wafer W, that is, the edge trimming is performed, as illustrated in FIG. 4C. At this time, the peripheral portion We is separated from a central portion (radially inner side than the peripheral portion We) of the first wafer W starting from the peripheral modification layer M1, and is completely separated from the second wafer S starting from the non-bonding region Ae. At this time, the peripheral portion We being removed is broken into small pieces starting from the split modification layer M2.

In the removal of the peripheral portion We, a blade B (see FIG. 4C) having a wedge shape, for example, may be inserted into the interface between the first wafer W and the second wafer S forming the combined wafer T.

The combined wafer T from which the peripheral portion We of the first wafer W has been removed is then transferred to the cleaning apparatus 80 by the wafer transfer device 40. In the cleaning apparatus 80, the first wafer W whose peripheral portion We is removed and/or the second wafer S is cleaned.

As illustrated in FIG. 4D, in the cleaning apparatus 80, by radiating laser light L3 for cleaning to the first wafer W and the second wafer S, for example, the portions radiated with the laser light L3 may be modified and removed, so that remaining particles or the like may be removed (cleaned).

Thereafter, the combined wafer T after being subjected to all the required processings is transferred to the cassette C of the cassette placing table 10 by the wafer transfer device 20 via the wafer transfer device 40 and the transition device 30. In this way, the series of processes of the wafer processing in the wafer processing system 1 are completed.

In addition, in the above description, the peripheral modification layer M1 and the split modification layer M2 are formed in the internal modifying apparatus 60 after the non-bonding region Ae is formed in the interface modifying apparatus 50, as shown in FIG. 4A and FIG. 4B. However, the order of the processes of the wafer processing in the wafer processing system 1 is not limited thereto. That is, after the peripheral modification layer M1 and the split modification layer M2 are formed in the internal modifying apparatus 60, the non-bonding region Ae may be formed in the interface modifying apparatus 50.

A detailed method of forming the above-described non-bonding region Ae will be explained with reference to the accompanying drawings.

As described above, the present inventors have found out the way to form the non-bonding region Ae more appropriately by performing a temperature control over the combined wafer T when it is radiated with the interface laser light L2 in the interface modifying apparatus 50. Thus, in the wafer processing according to the present exemplary embodiment, the temperature of the combined wafer T is controlled in the interface modifying apparatus 50 under various conditions to thereby appropriately form the non-bonding region Ae.

First, in the interface modifying apparatus 50, a thickness and a structure of a layer (in the present exemplary embodiment, the laser absorption film Fw, for example) forming a separation surface of the first wafer W are acquired as layer information of the combined wafer T in which the non-bonding region Ae is to be formed. The acquired layer information of the combined wafer T is outputted to the control device 90.

The layer information of the combined wafer T may be acquired by the interface modifying apparatus 50, or may be acquired in advance at the outside of the interface modifying apparatus 50.

Further, the way to obtain the layer information of the combined wafer T is not particularly limited. For example, it may be measured by a sensor or the like, or may be obtained by taking an image of the combined wafer T with a camera or the like.

Once the layer information of the combined wafer T is acquired, the interface laser light L2 is then radiated to the inside of the combined wafer T held by the chuck 100, that is, to the laser absorption film Fw at a position corresponding to peripheral portion We of the first wafer W as the target of removal in the present exemplary embodiment based on the acquired layer information, to thereby form the non-bonding region Ae.

In the interface modifying apparatus 50, the interface laser light L2 is radiated from the laser radiation system 110 to the laser absorption film Fw formed on the first wafer W. The radiated interface laser light L2 is absorbed by the laser absorption film Fw. At this time, the laser absorption film Fw accumulates energy by absorbing the interface laser light L2, so that its temperature increases and it is expanded. As a result, a shear stress is generated at an interface between the first wafer W and the laser absorption film Fw due to the expansion of the laser absorption film Fw, which causes the separation at the interface between the first wafer W and the second wafer S (in the present exemplary embodiment, at the interface between the laser absorption film Fw and the bonding film Fs) where the bonding strength is weak. That is, the non-bonding region Ae in which the bonding strength is reduced due to the separation of the first wafer W and the second wafer S is formed at the position to which the interface laser light L2 is radiated.

Figure 6:
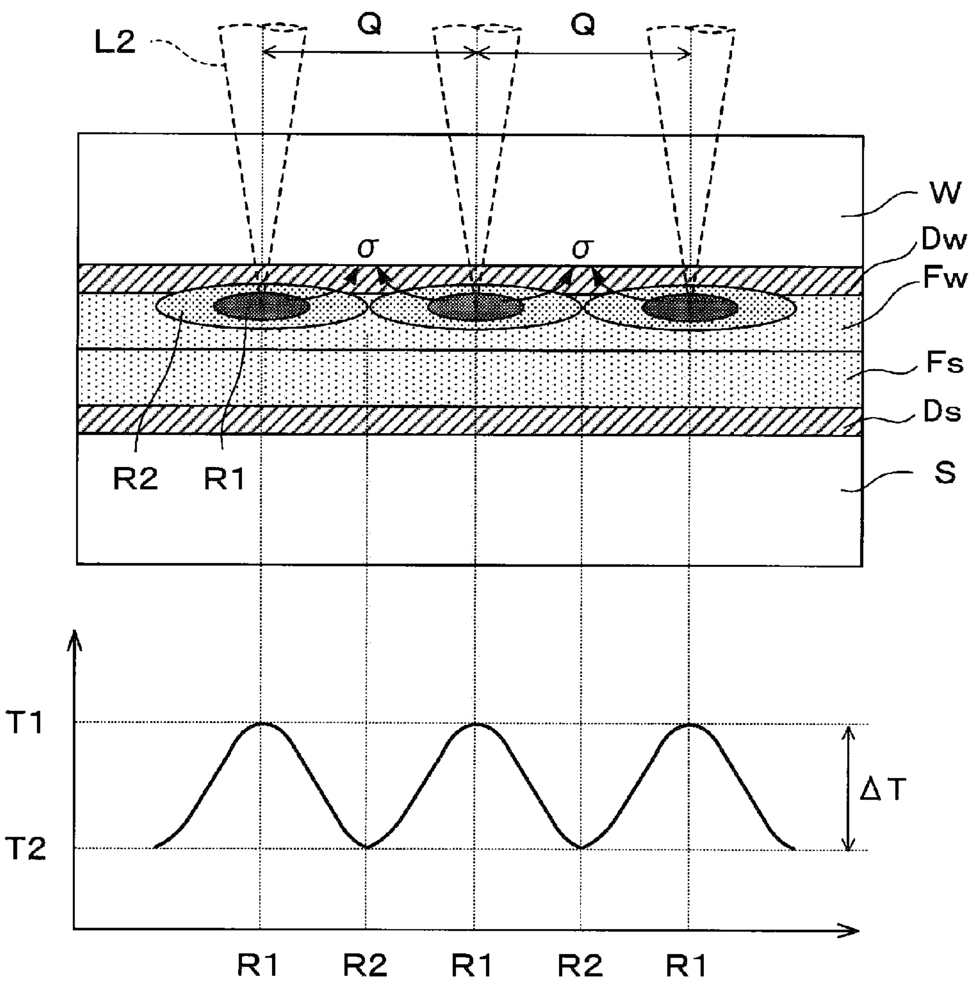
FIG. 6 is an explanatory diagram illustrating a temperature distribution when laser light for interface is radiated.

Here, the interface laser light L2 is radiated to the laser absorption film Fw in a pulse shape at an approximately constant radiation pitch Q (physical radiation interval of the interface laser light L2), as shown in FIG. 6.

At this time, a shear stress σ generated at the interface between the first wafer W and the laser absorption film Fw is deemed to increase with an increase of a temperature difference ΔT between a temperature T1 of a direct region R1 to which the interface laser light L2 is directly radiated downwards and a temperature T2 of a peripheral region R2 provided between the one direct region R1 and another direct region R1 that are formed sequentially, as shown in FIG. 6. In other words, in the interface modifying apparatus 50, by controlling the operation of forming the non-bonding region Ae such that the temperature difference ΔT shown in FIG. 6 increases, it is assumed that the peripheral portion We of the first wafer W can be appropriately removed in the edge trimming to be carried out later in the periphery removing apparatus 70.

In this regard, in the interface modifying apparatus 50 according to the present exemplary embodiment, at least one of the following controls is performed by the control device 90 in forming the non-bonding region Ae.

The first control is a method of controlling repetition frequency (hereinafter, simply referred to as "frequency") of the interface laser light L2 that is radiated to the laser absorption film Fw.

As described above, the laser absorption film Fw that has absorbed the interface laser light L2 undergoes the temperature increase as the energy is accumulated therein. At this time, as for the temperature of the laser absorption film Fw, the temperature of the direct region R1 directly under the radiation of the interface laser light L2 increases largely, and the temperature of the peripheral region R2 also increases.

In this case, if the frequency of the interface laser light L2 is high, the interface laser light L2 for forming another direct region R1 is radiated before the peripheral region R2 whose temperature has risen due to the formation of one direct region R1 is cooled. That is, in the continuous formation of one direct region R1 and another direct region R1 adjacent to each other, the temperature T2 of the peripheral region R2 therebetween remains high, which raises a risk that the temperature difference ΔT may not be achieved.

As a resolution, in the present exemplary embodiment, the frequency of the interface laser light L2 is changed based on the layer information of the combined wafer T acquired prior to the radiation of the interface laser light L2. More specifically, the frequency of the interface laser light L2 to be radiated to a portion (for example, a portion where the thickness of the laser absorption film Fw is large, or a portion where the laser absorption film Fw is of a kind difficult to separate) regarded based on the layer information as being difficult to separate is set to be smaller as compared to those at the other portions that can be normally separated.

By reducing the frequency of the interface laser light L2 in this way, a temporal pulse interval of the interface laser light L2 increases (for example, by halving the frequency of the interface laser light L2, the temporal pulse interval is doubled). If the temporal pulse interval of the interface laser light L2 is lengthened, the amount of natural cooling of the peripheral region R2 at the corresponding pulse interval increases. Accordingly, the temperature T2 of the peripheral region R2 is lowered in the next radiation of the interface laser light L2, so that the temperature difference ΔT shown in FIG. 6 can be enlarged.

In other words, according to the technique of the present disclosure, based on the layer information at the radiation position of the interface laser light L2, the temperature difference ΔT is controlled independently in the portion regarded as being difficult to separate and the other regions that can be normally separated.

Figure 7:
FIG. 7 presents tables showing separation states of the first wafer under various conditions.

Here, FIG. 7 presents tables showing separation states of the first wafer W and the second wafer S in the cases of forming the non-bonding region Ae by using the interface laser light L2 having different frequencies. In the present exemplary embodiment, the separation states of the first wafer W and the second wafer S are investigated for the two cases where the frequency of the interface laser light L2 is set to be 100 kHz and 50 kHz. Further, in the present exemplary embodiment, conditions (for example, the thickness and the structure of the laser absorption film Fw as the layer information of the laser absorption film Fw, the rotation speed of the combined wafer T, etc.) other than the frequency of the interface laser light L2 are set to be the same.

As illustrated in FIG. 7, even when the interface laser light L2 is radiated with the same radiation pitch Q (see FIG. 6) and the same energy amount to the laser absorption film Fw having the same layer information, it is found out that the range of conditions under which the first wafer W and the second wafer S can be separated without problems is expanded by lowering the frequency.

This is deemed to be because even when the interface laser light L2 is radiated with the same radiation pitch Q and the same energy amount, cooling time for the peripheral region R2 increases due to the decrease of the frequency, which results in an increase of the temperature difference ΔT shown in FIG. 6.

Further, from the viewpoint of properly separating the first wafer W and the second wafer S by forming the non-bonding region Ae, the radiation pitch Q, which is the physical radiation interval of the interface laser light L2, is desirably controlled to a predetermined constant value. In other words, it is desirable that the radiation pitch Q is controlled to be constant at the portion where the separation is difficult to carry out, which is obtained based on the above-described layer information, and at the other portions where the separation can be normally carried out.

Taking this into account, in order to control the radiation pitch Q of the interface laser light L2 to be approximately constant, it is desirable that a rotation speed (corresponding to the radiation pitch Q in the circumferential direction) and a moving speed in the horizontal direction (corresponding to the radiation pitch Q in the radial direction) of the combined wafer T is appropriately changed according to the frequency of the interface laser light L2. More specifically, when the frequency of the interface laser light L2 is lowered, it is desirable to perform a control so that the radiation pitch Q of the interface laser light L2 becomes constant by reducing the rotation speed and the moving speed of the combined wafer T simultaneously.

However, although the first wafer W and the second wafer S can be separated to form the non-bonding region Ae appropriately when the frequency of the interface laser light L2 is reduced (to a low frequency) or changed appropriately as described above, the time required to form the non-bonding region Ae in the entire surface of the peripheral portion We increases. In other words, when performing the frequency control for the interface laser light L2 in the interface modifying apparatus 50, there is a trade-off relationship between appropriately forming the non-bonding region Ae and improving the throughput related to the formation of the non-bonding region Ae.

In view of this, it is desirable to radiate the interface laser light L2 at a minimum controllable frequency in consideration of the throughput in the interface modifying apparatus 50. In the present exemplary embodiment, by reducing the frequency of the interface laser light L2 to form the non-bonding region Ae appropriately only at the portion where the first wafer W and the second wafer S are regarded as being difficult to separate and, also, by returning the frequency of the interface laser light L2 (to a high frequency) at the other portions where the separation can be normally achieved, deterioration of the throughput is suppressed.

In addition, the time required for the peripheral region R2, whose temperature has risen due to the formation of one direct region R1, to be cooled to a temperature that it has before being radiated with the interface laser light L2 is assumed to be constant according to the energy amount of the interface laser light L2 regardless of the frequency of the interface laser light L2.

Taking this into consideration, it is desirable that the frequency of the interface laser light L2 is controlled such that the temporal pulse interval of this interface laser light L2 becomes equal to or larger than the time taken for the peripheral region R2 to be cooled to the temperature before the radiation of the interface laser light L2.

Furthermore, when the laser head 111 has the above-described spatial light modulator (for example, LCOS), the interface laser light L2 may be radiated to multiple points of the laser absorption film Fw at the same time, when viewed from the top. At this time, in order to make proper use of the separation effect of the first wafer W and the second wafer S due to the aforementioned temperature difference ΔT, it is desirable that the multiple points (multiple light-converging points) within the surface of the laser absorption film Fw to which the interface laser light L2 is radiated at the same time are arranged so as not to be adjacent to each other at least in the circumferential direction and the radial direction when viewed from the top.

Figures 8A, 8B:
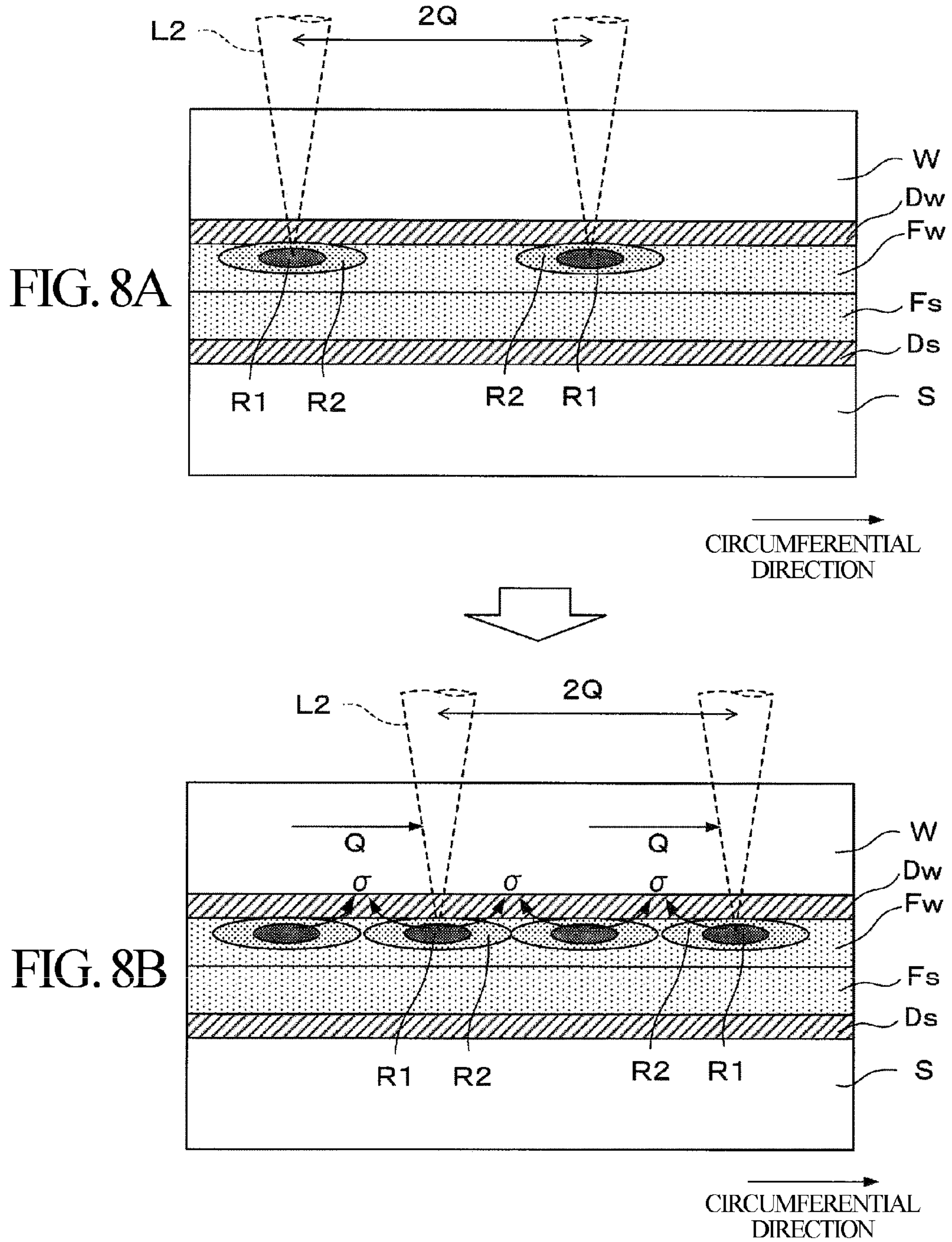
FIG. 8A and FIG. 8B are explanatory diagrams illustrating another example of the radiation of the laser light for interface.

To elaborate, as shown in FIG. 8A, for example, by radiating a plurality of (two in the shown example) interface laser lights L2 at a radiation interval twice the radiation pitch Q (see FIG. 6) in the circumferential direction of the combined wafer T (at an interval of a size of one peripheral region R2 corresponding to one direct region R1), a plurality of one direct regions R1 may be formed simultaneously. Subsequently, as shown in FIG. 8B, by radiating the plurality of interface laser lights L2 sequentially while moving the position of the light-converging point of each of the plurality of interface laser lights L2 in the circumferential direction as much as the radiation pitch Q, formation of a plurality of other direct regions R1 may be performed simultaneously. Thus, when viewed from the top, the separation of the first wafer W and the second wafer S occurs simultaneously at the multiple points of the laser absorption film Fw, so that the throughput related to the formation of the non-bonding region Ae can be improved.

At this time, by controlling the frequency of the interface laser light L2 based on the layer information of the combined wafer T as described above, the temperature of the peripheral regions R2 between the plurality of one direct regions R1 and the plurality of other direct regions R1 can be reduced when forming the plurality other direct regions R1. As a result, the temperature difference ΔT shown in FIG. 6 can be increased to form the non-bonding region Ae appropriately.

Figure 8C:
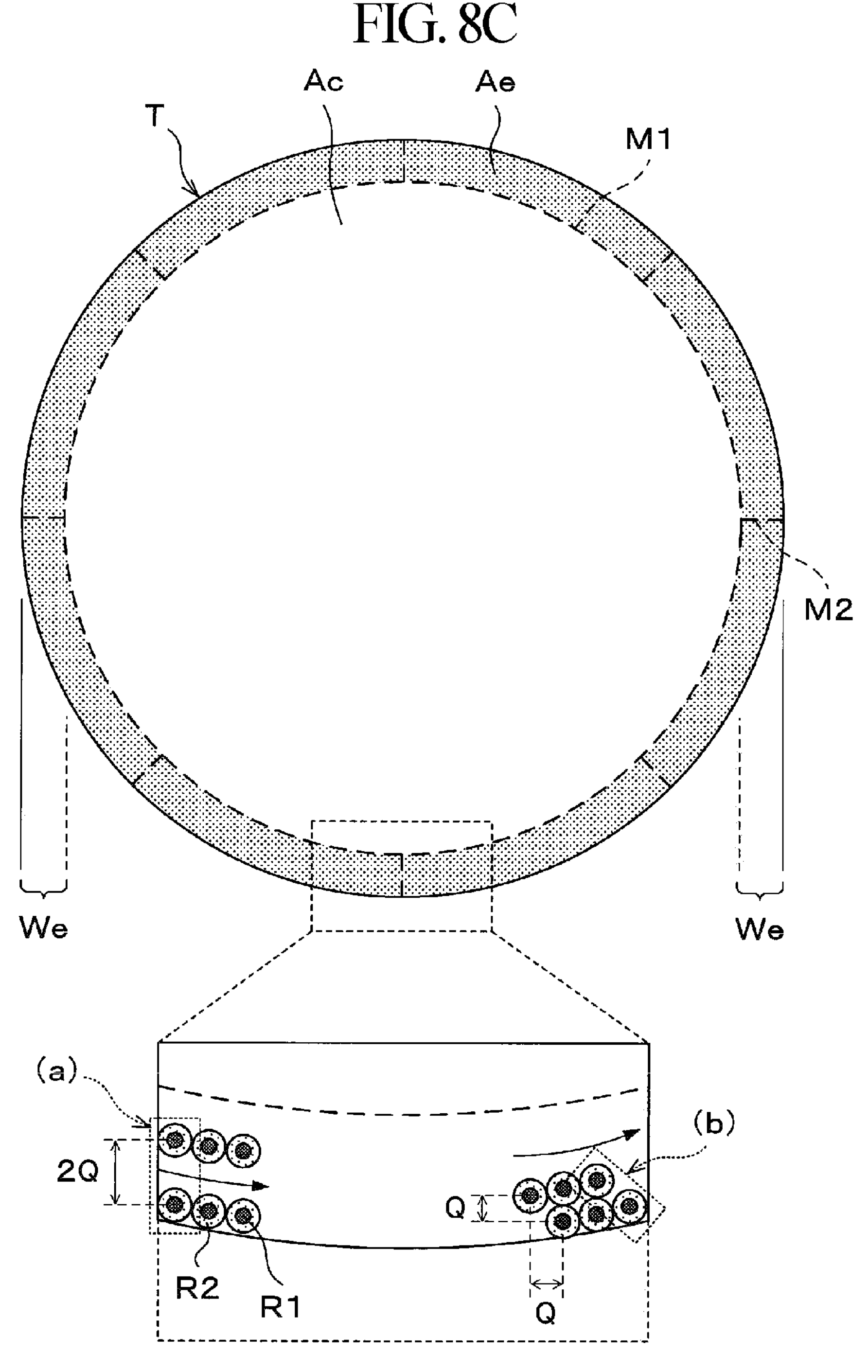
FIG. 8C is an explanatory diagram illustrating still another example of the radiation of the laser light for interface.

Additionally, the arrangement of the plurality of interface laser lights L2 radiated simultaneously is not limited to the arrangement shown in FIG. 8A and FIG. 8B in which they are arranged at an interval therebetween in the circumferential direction. As depicted in (a) of FIG. 8C, the plurality of (two in the shown example) interface laser lights L2 may be arranged at an interval (twice the radiation pitch Q) in the radial direction of the combined wafer T. Also, as shown in (b) of FIG. 8C, for example, the plurality of (two in the shown example) interface laser lights L2 may be arranged at a radiation interval of the radiation pitch Q both in the radial direction and the circumferential direction of the combined wafer T. That is, a plurality of light-converging points may be positioned so as to be obliquely arranged when viewed from the top.

In this way, in the present exemplary embodiment, the plurality of light-converging points are positioned so as not to be adjacent to each other at least in the circumferential direction and the radial direction when viewed from the top of the laser absorption film Fw, and the plurality of interface laser lights L2 are radiated simultaneously. Accordingly, the temperature difference ΔT with respect to the temperature T2 of the peripheral regions R2 between the plurality of one direct regions R1 and the plurality of other direct regions R1 subsequently formed can be increased. As a result, the non-bonding regions Ae can be appropriately formed simultaneously at the multiple points when viewed from the top, so that the throughput associated with the formation of the non-bonding region Ae can be improved.

Moreover, the number of the interface laser lights L2 that are simultaneously radiated is not limited to two, and three or more interface laser lights L2 may be radiated to the laser absorption film Fw at the same time. At this time, the positions of the light-converging points of the three or more interface laser lights L2 may be arranged at an interval therebetween in the circumferential direction, radial direction, or oblique direction of the combined wafer T when viewed from top, or layouts in the circumferential direction, the radial direction, or the oblique direction may be combined.

The second control is a method of cooling the combined wafer T by the cooling mechanism 100*a* disposed inside the chuck 100.

As stated above, the shear stress σ generated at the interface between the first wafer W and the laser absorption film Fw is deemed to increase with the increase of the temperature difference ΔT between the temperature T1 of the direct region R1 and the temperature T2 of the peripheral region R2.

In consideration of this, by cooling the combined wafer T with the cooling mechanism 100*a* when the interface laser light L2 is radiated, the temperature T2 of the peripheral region R2 may be reduced, thus increasing the temperature difference ΔT shown in FIG. 6.

Further, in the example shown in FIG. 3, the cooling mechanism 100*a* is disposed inside the chuck 100. However, the configuration and the layout of the cooling mechanism 100*a* are not limited thereto.

Specifically, instead of or in addition to disposing the cooling mechanism 100*a* inside the chuck 100, an air nozzle 100*b* configured to supply cooling air Air to the front surface of the combined wafer T (the rear surface Wb of the first wafer W) may be disposed as the cooling mechanism. The air nozzle 100*b* is connected to a cooling air source 113. Further, the temperature of the cooling air Air is not particularly limited as long as the combined wafer T can be cooled and the radiation of the interface laser light L2 is not hindered. For example, it may be a room temperature, or a low temperature or extremely low temperature below the room temperature.

The air nozzle 100*b* supplies the cooling air Air from above to the central portion of the combined wafer T when the interface laser light L2 is radiated to the combined wafer T, thus cooling the entire surface of the combined wafer T by a centrifugal force. Thus, by cooling the combined wafer T, the temperature T2 of the peripheral region R2 can be reduced, so that the temperature difference ΔT shown in FIG. 6 can be increased.

Further, in the case of supplying the cooling air Air to the peripheral region R2 locally in this way, the radiation position of the interface laser light L2 may be decided based on the supply position of the cooling air Air. In other words, the radiation of the interface laser light L2 may be performed by using the cooling air Air as a guide.

Additionally, from the viewpoint of forming the non-bonding region Ae by appropriately separating the first wafer W and the second wafer S, at least the temperature difference ΔT between the direct region R1 directly under the radiation of the interface laser light L2 and the peripheral region R2 around it needs to be increased. In other words, it is not always necessary to cool the entire surface of the combined wafer T the way the cooling mechanism 100*a* and the air nozzle 100*b* does described above. It is believed that the non-bonding region Ae can be appropriately formed as long as at least the peripheral region R2 around the radiation of the interface laser light L2 can be cooled. From this point of view, a mechanism configured to locally cool the peripheral region R2 may be provided instead of or in addition to the cooling mechanism 100*a* and the air nozzle 100*b* described above.

Figure 9A:
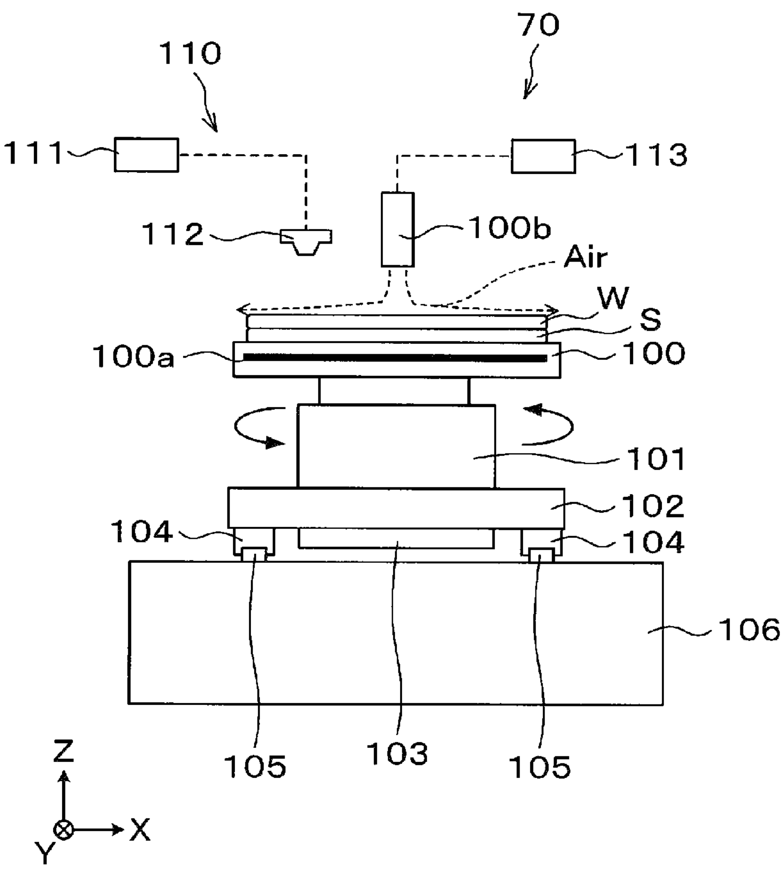
FIG. 9A is a side view illustrating another configuration of the interface modifying apparatus.
Figures 9B, 9C:
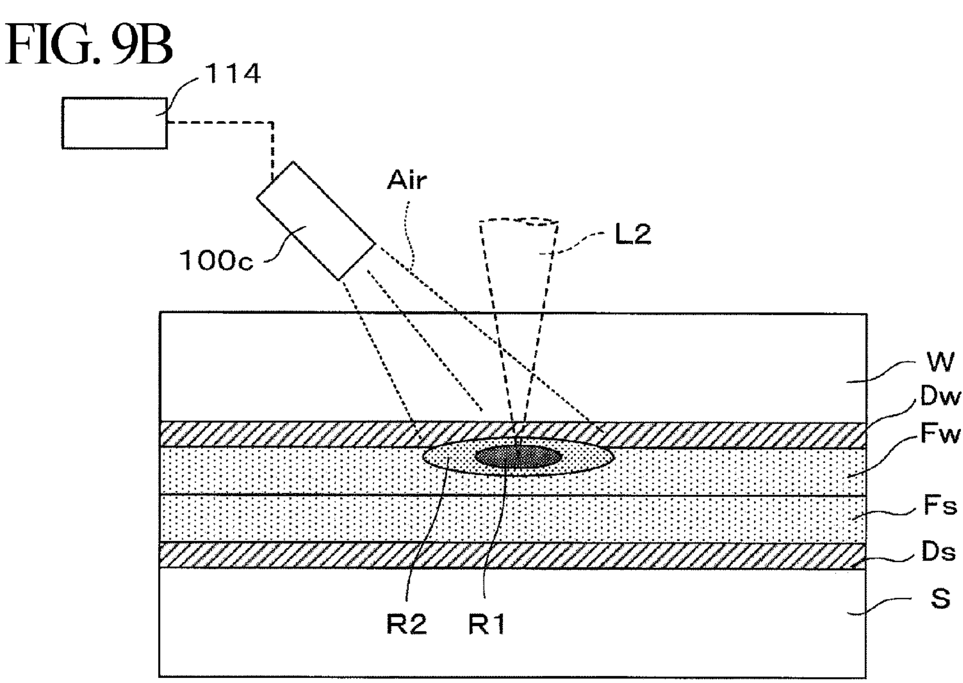
FIG. 9B is an explanatory diagram illustrating another configuration of a cooling device.
FIG. 9C is an explanatory diagram illustrating still another configuration of the cooling device.

To elaborate, as shown in FIG. 9B, an air nozzle 100*c* configured to supply cooling air Air toward the peripheral region R2 when the interface laser light L2 is radiated to the combined wafer T may be disposed as the cooling mechanism, for example. The air nozzle 100*c* is connected to a cooling air source 114. With this configuration, the temperature T2 of the peripheral region R2 can be reduced, so that the temperature difference ΔT shown in FIG. 6 can be increased.

In addition, the air nozzle 100*c* that locally cools the peripheral region R2 may be integrated with the laser radiation system 110 configured to radiate the interface laser light L2, as shown in FIG. 9C.

In the interface modifying apparatus 50 according to the present exemplary embodiment, at least one of the above-described controls is executed by the control device 90 to form the non-bonding region Ae in the entire surface of the combined wafer T at the position corresponding to the peripheral portion We of the first wafer W to be removed.

According to the present exemplary embodiment, in the formation of the non-bonding region Ae, the control of increasing the temperature difference ΔT between the temperature T1 of the direct region R1 directly under the radiation of the interface laser light L2 and the temperature T2 of the peripheral region R2 is performed. Specifically, by controlling at least one of the frequency of the interface laser light L2 or the temperature of the combined wafer T, the temperature T2 of the peripheral region R2 in the radiation of the interface laser light L2 can be lowered, whereby the temperature difference ΔT can be increased.

Thus, the shear stress σ generated between the direct region R1 and the peripheral region R2 when the laser absorption film Fw is expanded as a result of absorbing the interface laser light L2 can be increased, and, resultantly, the first wafer W and the second wafer S can be properly separated.

Further, according to the present exemplary embodiment, this temperature control is performed only for a portion, especially within the surface of the peripheral portion We, where the separation between the first wafer W and the second wafer S is deemed to be difficult to achieve under the normal high-frequency separation conditions (radiation conditions of the interface laser light L2). Thus, at the portion where the separation is difficult to achieve under the normal separation conditions, the non-bonding region Ae can be formed by appropriately separating the first wafer W and the second wafer S. Meanwhile, at the other portions, by radiating the interface laser light L2 under the normal separation conditions, the deterioration of throughput due to the formation of the non-bonding region Ae can be suppressed, so that the efficiency of the formation of the non-bonding region Ae in the interface modifying apparatus 50 can be improved.

In addition, in the above-described exemplary embodiment, the portion where the separation is difficult is detected based on the layer information acquired in advance, and the control of increasing the temperature difference ΔT for the portion where the first substrate W and the second substrate S are difficult to separate (a temperature control over the combined wafer T and a control over the radiation conditions for the interface laser light L2) are performed. In the interface modifying apparatus 50, however, the same control may also be performed to separate the first wafer W and the second wafer S appropriately at a radially inner side than the peripheral portion We (on the side where the peripheral modification layer M1 is formed) where processing quality in the edge trimming is important. In other words, based on the position of the light-converging point of the interface laser light L2 within the surface of the combined wafer T, a control over the frequency of the interface laser light L2 (temperature difference ΔT shown in FIG. 6) may be performed.

In this case, by increasing the temperature difference ΔT at the radially inner side than the peripheral portion We where the formation precision of the non-bonding region Ae affects the processing quality of the edge trimming, the first wafer W and the second wafer S can be properly separated to thereby improve the processing precision and the processing quality of the edge trimming. Also, by setting the frequency of the interface laser light L2 radiated to a radially outer side than the peripheral portion We (edge side of the first wafer W) where the formation precision of the non-bonding region Ae has a small effect on the processing quality to a high frequency (normal separation condition), a throughput related to the formation of the non-bonding region Ae can be improved.

Moreover, in the above-described exemplary embodiment, although the non-bonding region Ae (separation surface) is formed at the interface between the laser absorption film Fw and the bonding film Fs by radiating the interface laser light L2 to the laser absorption film Fw formed at the interface between the first wafer W and the second wafer S, as shown in FIG. 4A to FIG. 4D, the position where the non-bonding region Ae is formed is not limited thereto as long as the peripheral portion We of the first wafer W can be appropriately removed.

To elaborate, the non-bonding region Ae is formed at the interface where the bonding strength between the first wafer W and the second wafer S is weak. However, this interface at which the non-bonding region Ae is formed may be an interface between the laser absorption film Fw and the first wafer W or the device layer Dw, or an interface between the first wafer W and the device layer Ds. Further, the non-bonding region Ae may be formed by radiating the interface laser light L2 to the bonding film Fs instead of the laser absorption film Fw, for example.

In addition, although the above exemplary embodiment has been described for the example in which the peripheral portion We of the first wafer W is removed in the combined wafer T in which the first wafer W and the second wafer S are bonded, the technique of the present disclosure may also be applicable to a case of removing the entire first wafer W from the second wafer S, that is, to a so-called laser lift-off processing for the combined wafer T.

Figures 10A, 10B:
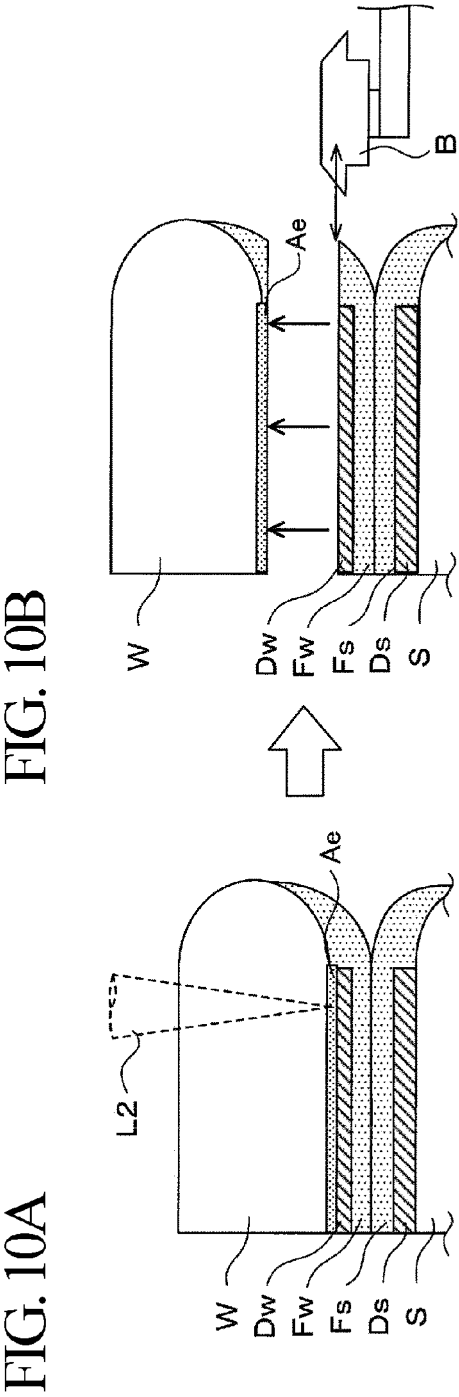
FIG. 10A and FIG. 10B are explanatory diagrams illustrating another application example of a technique according to the present disclosure.

To be specific, as shown in FIG. 10A and FIG. 10B, even in case of forming the non-bonding region Ae at the entire bonding interface between the first wafer W and the second wafer S in the combined wafer T, it is still possible to separate the first wafer W from the second wafer S appropriately by increasing the temperature difference ΔT between the direct region R1 and the peripheral region R2 in the formation of the non-bonding region Ae. At this time, the frequency of the interface laser light L2 radiated to the interface between the first wafer W and the second wafer S may be desirably decided based on the layer information acquired in advance.

Figure 11A:
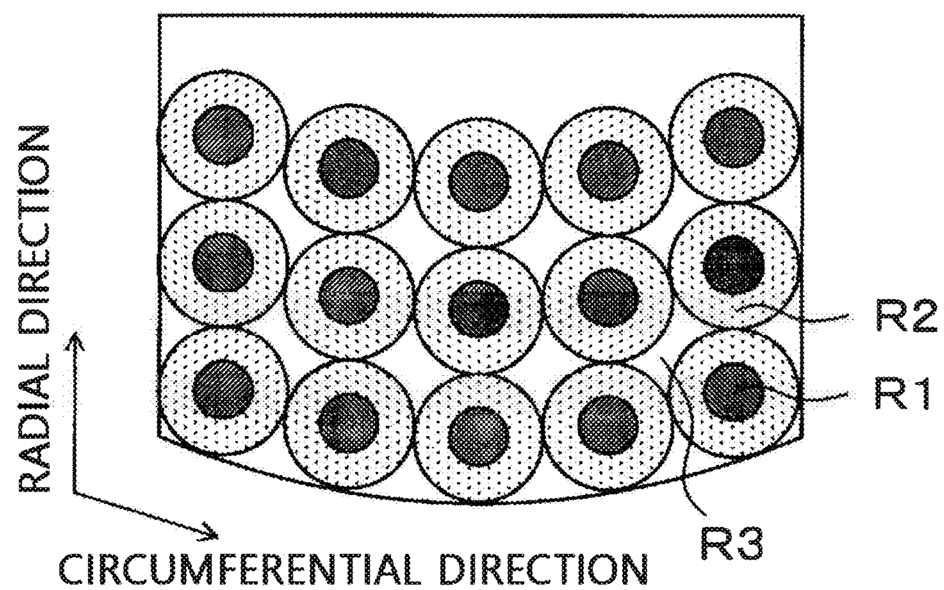
FIG. 11A is an explanatory diagram illustrating a laser shape of the laser light for interface.

Furthermore, in the above-described exemplary embodiment, the shape of the interface laser light L2 (the shape of the light-converging point thereof) radiated to the interface between the first wafer W and the second wafer S is not particularly limited. However, as shown in FIG. 6, for example, when the shape of the light-converging point of the interface laser light L2 is round, there may be formed a region (white portion in FIG. 11A: hereinafter, referred to as "non-heating region R3") which is not affected by the heat of the interface laser light L2 at the interface (laser absorption film Fw) between the first wafer W and the second wafer S when viewed from the top, as shown in FIG. 11A, and there is a risk that the non-bonding region Ae may not be properly formed in this non-heating region R3.

In this regard, when the laser head 111 has the above-described spatial light modulator (for example, LCOS), it is desirable to control the shape of the light-converging point of the interface laser light L2 so as to reduce the area of the non-heating region R3.

Figure 11B:
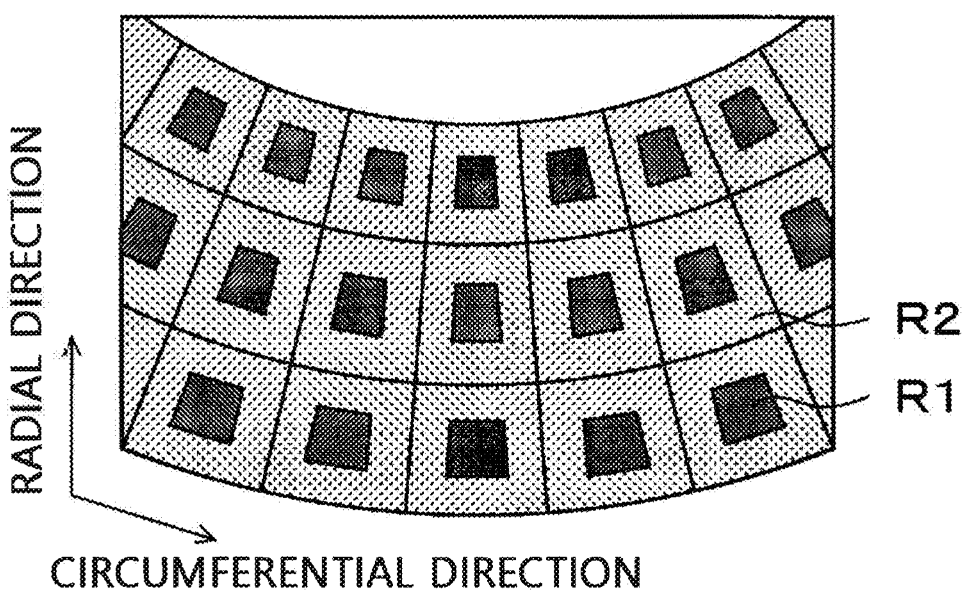
FIG. 11B is an explanatory diagram illustrating a modification example of the laser shape of the laser light for interface.

Specifically, it is desirable that the shape of the light-converging point of the interface laser light L2 is controlled to be an approximately trapezoidal shape having a short side at a radially inside of the combined wafer T and a long side at a radially outside of the combined wafer T when viewed from the top, as illustrated in FIG. 11B, for example. At this time, when forming the non-bonding region Ae in the entire bonding interface between the first wafer W and the second wafer S in particular, it is desirable that the length of the short side and/or the long side of the approximately trapezoidal shape (that is, the width of the trapezoidal shape) becomes smaller as the radiation position of the interface laser light L2 moves toward the radially inner side of the combined wafer T.

In this way, by setting the radiation shape of the interface laser light L2 to the approximately trapezoidal shape, the non-heating region R3 formed at the interface (laser absorption film Fw) between the first wafer W and the second wafer S can be eliminated or its area can be reduced, so that the entire surface of the peripheral portion We, which is the target of the formation of the non-bonding region Ae, can be appropriately separated.

Moreover, the radiation shape of the interface laser light L2 is not limited to the shape shown in FIG. 11B. For example, the short side and/or the long side of the trapezoidal shape may have a curvature that matches the concentric shape of the combined wafer T (laser absorption film Fw). In this case, the area of the non-heating region R3 can be further reduced.

Figure 11C:
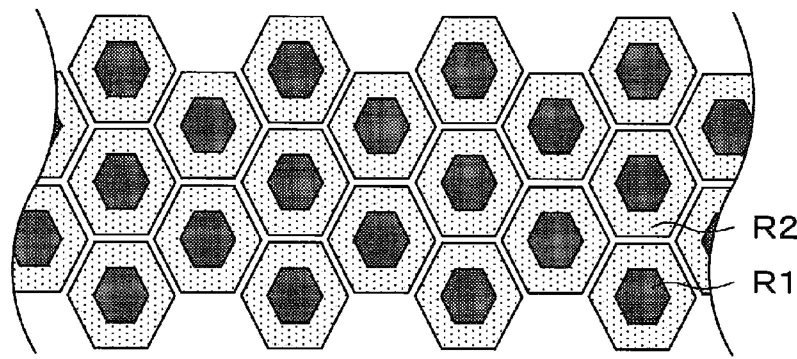
FIG. 11C is an explanatory diagram illustrating another modification example of the laser shape of the laser light for interface.
Figure 11D:
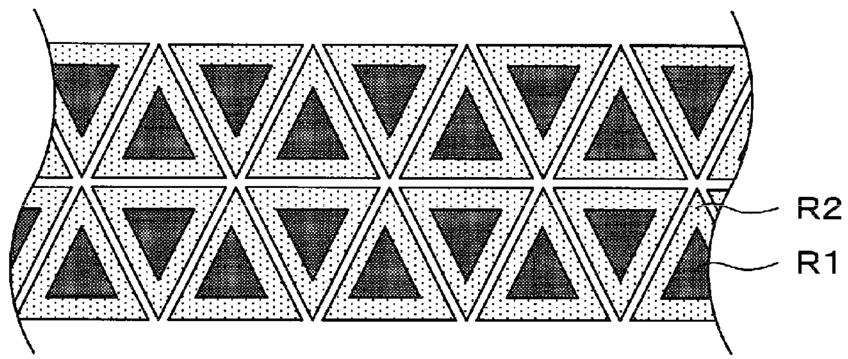
FIG. 11D is an explanatory diagram illustrating still another modification example of the laser shape of the laser light for interface.

Also, as long as the area of the aforementioned non-heating region R3 can be made small at least, the radiation shape of the interface laser light L2 is not limited to the approximately trapezoidal shape. For example, as shown in FIG. 11C, polygons (hexagons in the shown example) larger than quadrangles may be densely arranged, or triangles may be densely arranged in vertically reverse directions as shown in FIG. 11D.

In addition, although the above-described exemplary embodiment has been described for the example in which the laser absorption film Fw is an oxide film formed on the device layer Dw as shown in FIG. 1, the laser absorption film configured to absorb the laser light may be formed between the first wafer W and the device layer Dw.

Figure 12:
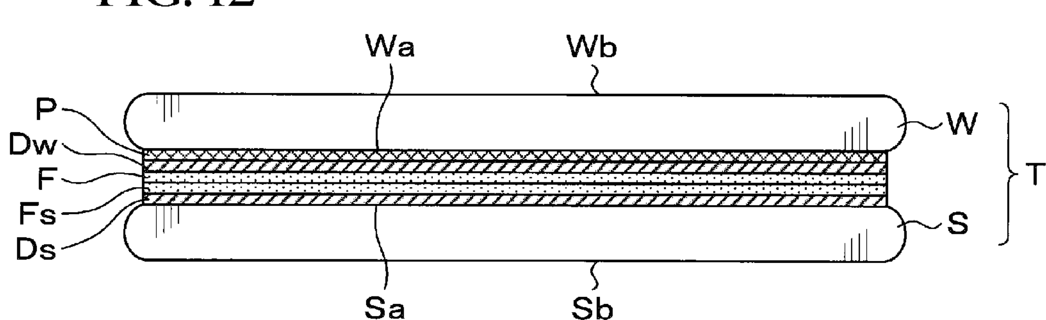
FIG. 12 is a side view illustrating another example of the structure of the combined wafer.

To be more specific, as depicted in FIG. 12, a laser absorption film P, the device layer Dw, and the bonding film F are stacked on the front surface Wa of the first wafer W in this order, and the device layer Ds and the bonding film Fs are formed on the front surface Sa of the second wafer S in this order.

The laser absorption film P is, for example, an oxide film (a $SiO_2$ film or a TEOS film), and absorbs laser light, the same as the laser absorption film Fw described above. The device layers Dw (Ds) include a plurality of devices. The bonding film F (Fs) may be, by way of example, an oxide film (a THOX film, a $SiO_2$ film, or a TEOS film), a SIC film, a SiCN film, or an adhesive, and the first wafer W and the second wafer S are bonded to each other with the bonding films F and Fs therebetween.

Hereinafter, a method of removing the first wafer W from the second wafer S in a case where the laser absorption film P configured to absorb laser light is formed between the first wafer W and the device layer Dw will be explained.

The following description will be provided for an example in which the entire first wafer W is removed from the second wafer S, that is, the device layer Dw formed on the first wafer W is transferred to the second wafer S, as illustrated in FIG. 10A and FIG. 10B.

Figure 13:
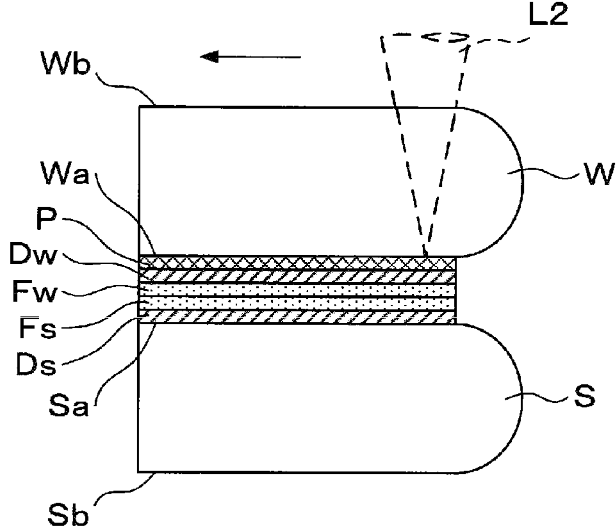
FIG. 13 is an explanatory diagram illustrating the combined wafer radiated with the laser light.
Figure 14:
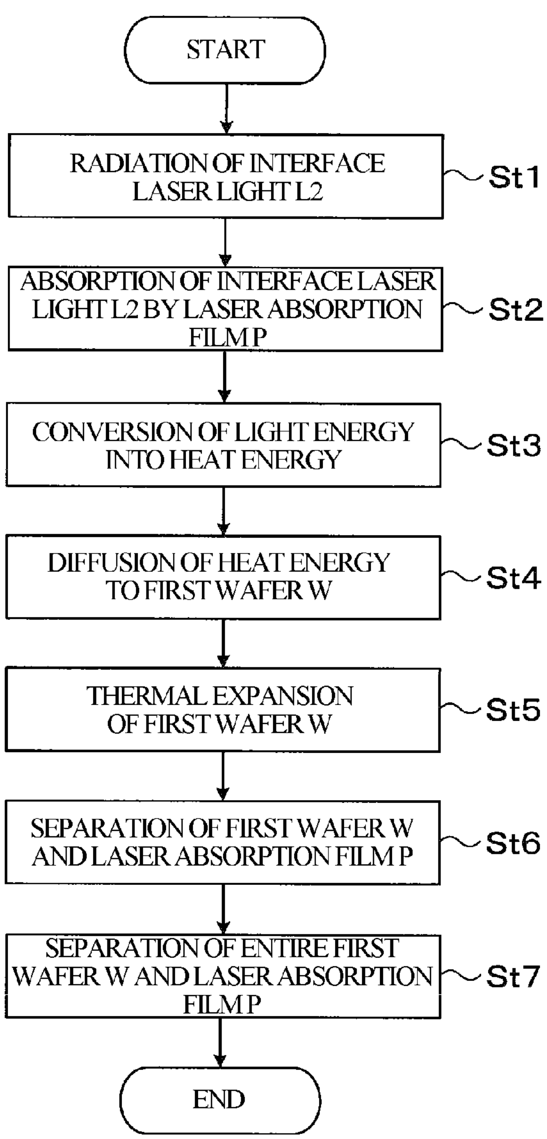
FIG. 14 is a flowchart showing main processes of the wafer processing in the wafer processing system.

To transfer the device layer Dw to the second wafer S, first, the interface laser light L2 ($CO_2$ laser light) is radiated in a pulse shape to the laser absorption film P, more specifically, to an interface between the laser absorption film P and the first wafer W in the interface modifying apparatus 50, as shown in FIG. 13 (process St1 in FIG. 14). The interface laser light L2 radiated from the rear surface Wb side of the first wafer W penetrates silicon (first wafer W) to be absorbed into the laser absorption film P, as illustrated in FIG. 13 (process St2 in FIG. 14).

The interface laser light L2 absorbed by the laser absorption film P is converted into heat according to its energy distribution (process St3 in FIG. 14). In other words, the temperature of the laser absorption film P increases due to the absorption of the interface laser light L2.

Figure 15:
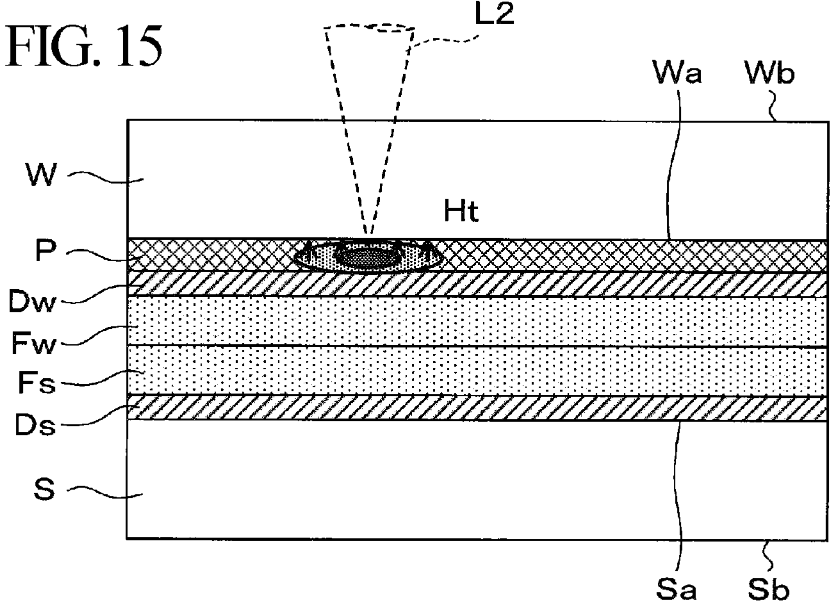
FIG. 15 is an explanatory diagram illustrating diffusion of heat generated in the combined wafer.

Most of heat Ht (see FIG. 15) generated in the laser absorption film P due to the absorption of the interface laser light L2 is diffused toward the first wafer W, as shown in FIG. 15 (process St4 in FIG. 14). In other words, the temperature of the interface between the laser absorption film P and the first wafer W (silicon) increases due to the heat diffusion from the laser absorption film P.

When the heat generated in the laser absorption film P is diffused toward the first wafer W, a portion of the first wafer W to which the interface laser light L2 is radiated is locally expanded (plastically deformed into a downwardly convex shape with respect to the laser absorption film P) due to the effect of the heat, that is, due to the temperature increase of the interface between the laser absorption film P and the first wafer W according to a temperature distribution. (process St5 in FIG. 14).

Hereinafter, the region affected by the heat generated by the radiation of the interface laser light L2 may be referred to as "radiation region R" of the interface laser light L2. In other words, the first wafer W locally expands in the radiation region R of the interface laser light L2.

Then, in the interface modifying apparatus 50, the interface laser light L2 is radiated to the entire surface of the laser absorption film P when viewed from the top. In other words, as shown in FIG. 17, the interface laser light L2 is radiated to the entire surface of the laser absorption film P multiple times at a certain interval.

At this time, the first wafer W expands locally each time the interface laser light L2 is radiated, that is, a plurality of radiation regions R are formed at different portions of the first wafer W at a certain distance therebetween, when viewed from the top.

Figure 17:
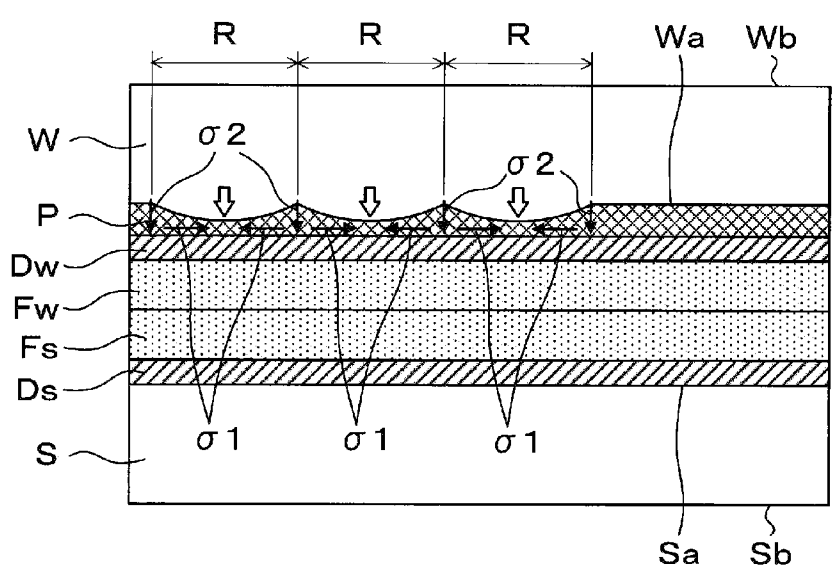
FIG. 17 is an explanatory diagram illustrating the combined wafer radiated with the laser light.

Here, when the first wafer W expands, the laser absorption film P is pressed from above (the first wafer W side) due to the expansion of the first wafer W, whereby a compressive stress σ1 is generated in the laser absorption film P at the radiation position of the interface laser light L2, as shown in FIG. 17. The generated compressive stress σ1 acts in a direction (a downward direction toward the laser absorption film P in the drawing) in which the first wafer W and the laser absorption film P are separated, so that a separation stress σ2 is generated, as illustrated in FIG. 17.

Figure 16:
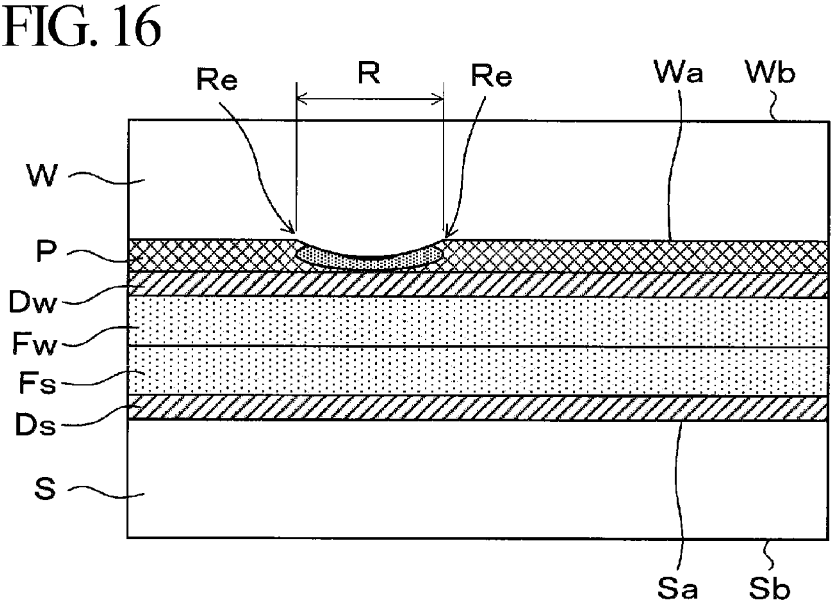
FIG. 16 is an explanatory diagram illustrating expansion of the first wafer due to the radiation of the laser light.

In other words, in the radiation region R of the interface laser light L2, the silicon (the first wafer W)) expands to generate the compressive stress σ1 in the direct region R1 (see FIG. 8A to FIG. 8C, etc.) directly under the radiation of the interface laser light L2, and, also, there is generated the separation stress σ2, which is a stress in the separation direction resulting from the compressive stress σ1, in the peripheral region R2, particularly, at an end portion Re (see FIG. 16) of the radiation region R. This separation stress σ2 is a tensile stress generated in the peripheral region R2 (see FIG. 8A to FIG. 8C, etc.) of the radiation region R.

The generated compressive stress σ1 and the separation stress σ2 are accumulated inside the laser absorption film P. At this time, at the end portion Re of the radiation region R, the separation stresses σ2 generated in the plurality of radiation regions R act synergistically (overlappingly).

Figure 18:
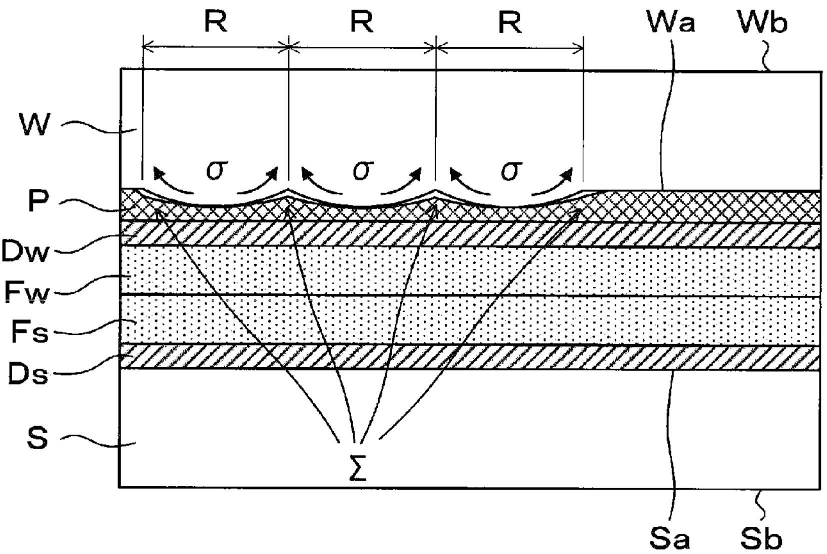
FIG. 18 is an explanatory diagram illustrating separation of the first wafer and a laser absorption film.

When the total accumulation amount (synergistic amount) of the separation stress σ2 at the end portion Re of the radiation region R exceeds an adhesive force Σ between the first wafer W and the laser absorption film P per unit area at the end portion Re ($n \times \sigma 2 > \Sigma$ (n is a natural number, which is the radiation number of the interface laser light L2), the separation occurs at the interface between the first wafer W and the laser absorption film P at the end portion Re of the radiation region R, as illustrated in FIG. 18, and, as a result, the bonding strength between the laser absorption film P and the first wafer W decrease (process St6 in FIG. 14).

In addition, the stress o (compressive stress σ1 and the separation stress σ2) accumulated inside the laser absorption film P is released as the first wafer W and the laser absorption film P are separated.

Figure 19:
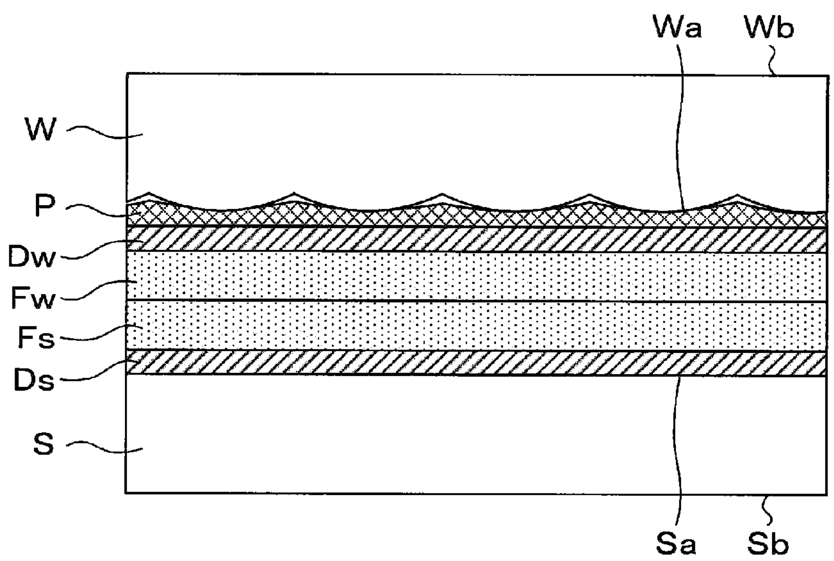
FIG. 19 is an explanatory diagram illustrating separation of the first wafer and the laser absorption film.

Then, in the interface modifying apparatus 50, by incurring the separation in the entire interface between the first wafer W and the laser absorption film P when viewed from the top, in other words, by connecting the separations that have occurred at the end portion Re of the radiation region R in the entire interface between the first wafer W and the laser absorption film P, as shown in FIG. 19, the bonding strength in the entire first wafer W and laser absorption film P are reduced, and, accordingly, the first wafer W and the laser absorption film P can be appropriately separated in a subsequent separation process (process St7 in FIG. 14).

Further, the separation of the first wafer W from the laser absorption film P may be performed in a non-illustrated separating apparatus disposed in the wafer processing system 1, or may be performed in the interface modifying apparatus 50. The method of separating the first wafer W from the laser absorption film P may be selected as required.

At this time, the combined wafer T after being radiated with the interface laser light L2 in the interface modifying apparatus 50, it is ideal that the first wafer Wis separated from the laser absorption film P in the entire surface thereof, that is, the first wafer W and the laser absorption film P are separated, due to the separation stress σ2, in a central portion of the radiation region R including the region directly under the radiation after the separation has occurred at the end portion Re of the radiation region R. As shown in FIG. 18, however, in the central portion (the region directly under the radiation of the interface laser light L2) of the radiation region R, the first wafer W and the laser absorption film P may remain connected (not separate) even after the separation occurs at the end portion Re of the radiation region R. For this reason, in the wafer processing system 1 according to the technique of the present disclosure, it is desirable to provide a non-illustrated separating apparatus and a process of separating the first wafer W from the combined wafer T in the separating apparatus in order to securely separate the first wafer W from the combined wafer T (laser absorption film P) in the combined wafer T after being radiated with the interface laser light L2.

Here, in the case of performing the separation of the first wafer W from the combined wafer T at a separation position such as the non-illustrated separating apparatus, if the transfer of the combined wafer T to the separation position is carried out in the aforementioned ideal state, that is, in the state that the entire first wafer W is separated from the laser absorption film P, there is a risk that the first wafer W may fall from the second wafer S due to an inertial force accompanying this transfer.

Further, if the entire first wafer W is separated from the laser absorption film P in this way, even if it is not necessary to transfer the combined wafer T after being radiated with the interface laser light L2 to the separation position, there is a risk that during the radiation of the interface laser light L2 to the laser absorption film P in the interface modifying apparatus 50, the first wafer W may fly off from the second wafer S due to a centrifugal force generated when the chuck 100 is rotated.

In view of this, in order to suppress the first wafer W from flying or falling during the radiation of the interface laser light L2 to the laser absorption film P as well as during the transfer of the combined wafer T, it is desirable to control the radiation conditions (radiation position, output, and so forth) for the interface laser light L2 in the interface modifying apparatus 50 such that the first wafer W and the laser absorption film P remain connected (not separated) at least a portion of the interface therebetween.

Accordingly, the first wafer W is suppressed from flying off or falling from the second wafer S as a result of being completely separated from the laser absorption film P during the radiation of the interface laser light L2 and its transfer to the separation position.

The transfer of the device layer Dw formed on the first wafer W to the second wafer S is carried out as described above. That is, in the interface modifying apparatus 50, the first wafer W is expanded by the heat generated by the radiation of the interface laser light L2. As a result, the compressive stress σ1 is generated in the laser absorption film P, which in turn results in the generation of the separation stress σ2 at the interface between the first wafer W and the laser absorption film P, thereby incurring separation at the interface between the first wafer W and the laser absorption film P and reducing the bonding strength therebetween. Then, after the bonding strength is reduced in the entire surfaces of the laser absorption film P and first wafer W, the first wafer W is removed by being raised from the laser absorption film P in the non-illustrated separating apparatus or the interface modifying apparatus 50, for example.

Additionally, although the above exemplary embodiment has been described for the example in which the whole of the first wafer W is removed from the second wafer S in the case where the laser absorption film P configured to absorb laser light is formed between the first wafer W and the device layer Dw, a part of the first wafer W may be removed from the second wafer S.

Specifically, the peripheral portion We as a part of the first wafer W may be removed from the second wafer S, that is, a so-called edge trimming process may be performed, as shown in FIG. 4A to FIG. 4D, for example.

Here, it should be noted that the above-described exemplary embodiments are illustrative in all aspects and are not anyway limiting. The above-described exemplary embodiments may be omitted, replaced and modified in various ways without departing from the scope and the spirit of claims.

According to the exemplary embodiment, it is possible to appropriately remove a part or the whole of the first substrate in the combined substrate in which the first substrate and the second substrate are bonded to each other.

We claim:

1. A processing method of processing a combined substrate in which a first substrate and a second substrate are bonded to each other, the processing method comprising:

acquiring layer information of the combined substrate;

forming a non-bonding region in which bonding strength between the first substrate and the second substrate is reduced, by radiating laser light in a pulse shape to a laser absorption film formed at an interface between the first substrate and the second substrate; and separating the first substrate from the second substrate, wherein in the forming of the non-bonding region, a temperature difference between a first temperature in a laser radiation direct region including one light-converging point of the laser light radiated in the pulse shape and a second temperature in a laser radiation peripheral region formed between the one light-converging point and another light-converging point to which the laser light is radiated after the one light-converging point is changed based on at least one of the acquired layer information or a position of the one light-converging point in the combined substrate in a radial direction.

2. The processing method of claim 1, further comprising:

expanding the first substrate by heat generated by radiating the laser light to the laser absorption film to cause separation at an interface between the first substrate and the laser absorption film in the laser light peripheral region due to a stress generated by the expanding of the first substrate.

3. The processing method of claim 2, wherein the laser light includes multiple laser lights, and the stress is accumulated by radiation of the multiple laser lights to the laser absorption film to cause separation of the first substrate and the laser absorption film by the accumulated stress.

4. The processing method of claim 3, further comprising;

causing the separation in different regions at the interface between the first substrate and the laser absorption film; and forming a separation surface as a starting point of the separation of the first substrate and the laser absorption film by connecting the separation caused in the different regions.

5. The processing method of claim 4, further comprising:

separating and removing at least a part of the first substrate from the combined substrate, starting from the separation surface as the starting point.

6. The processing method of claim 2, wherein the separation of the first substrate and the laser absorption film is caused by a tensile stress generated in the laser radiation peripheral region.

7. The processing method of claim 1, further comprising:

forming a peripheral modification layer serving as a starting point of separation of a peripheral portion of the first substrate as a removing target along a boundary between the peripheral portion of the first substrate and a central portion of the first substrate, wherein in the separating of the first substrate, the peripheral portion of the first substrate is separated from the second substrate.

8. The processing method of claim 7, wherein in the forming of the non-bonding region, the temperature difference on a radially inner side, which is a side of a position in the peripheral portion where the peripheral modification layer is formed, is set to be larger than the temperature difference on a radially outer side, which is an end side of the first substrate in the peripheral portion.

9. The processing method of claim 1, wherein the temperature difference in a region where the first substrate and the second substrate are difficult to separate, the region being detected based on the layer information, is set to be larger than the temperature difference in a region where the first substrate and the second substrate are normally separated.

10. The processing method of claim 1,
wherein the temperature difference between the laser radiation direct region and the laser radiation peripheral region is changed through a control over a frequency of the laser light radiated to the laser absorption film.

11. The processing method of claim 10,
wherein the frequency in a region where the first substrate and the second substrate are difficult to separate, the region being detected based on the layer information, is set to be smaller than the frequency in a region where the first substrate and the second substrate are normally separated.

12. The processing method of claim 1,
wherein the laser light includes multiple laser lights,
the multiple laser lights are simultaneously radiated to the laser absorption film in the forming of the non-bonding region, and
a position of the one light-converging point of each of the multiple laser lights simultaneously radiated is set at an interval of at least one laser radiation peripheral region in at least one of the radial direction or a circumferential direction of the combined substrate.

13. The processing method of claim 1,
wherein the laser light includes multiple laser lights,
the multiple laser lights are simultaneously radiated to the laser absorption film in the forming of the non-bonding region, and
a position of the one light-converging point of each of the multiple laser lights simultaneously radiated is set at an interval in both the radial direction and a circumferential direction of the combined substrate.

14. The processing method of claim 1,
wherein a shape of the laser light radiated to the laser absorption film in the forming of the non-bonding region is changed based on a position of the one light-converging point in the combined substrate in the radial direction.

15. The processing method of claim 14,
wherein the laser light has a trapezoidal shape with a short side on a radially inside of the combined substrate and a long side on a radially outside of the combined substrate.

16. The processing method of claim 1,
wherein the temperature difference between the laser radiation direct region and the laser radiation peripheral region is changed through a control with a cooling mechanism disposed inside a substrate holder configured to hold the combined substrate.

17. The processing method of claim 1,
wherein the temperature difference between the laser radiation direct region and the laser radiation peripheral region is changed by supplying cooling air from above the combined substrate.

18. The processing method of claim 17,
wherein a radiation position of the laser light to the laser absorption film is determined based on a supply position of the cooling air to be supplied to the combined substrate.

19. The processing method of claim 1,
wherein the layer information includes information of at least one of a thickness or a structure of the laser absorption film.

20. A processing system of processing a combined substrate in which a first substrate and a second substrate are bonded to each other,
wherein a laser absorption film is formed at an interface between the first substrate and the second substrate,
wherein the processing system comprises:
an interface modifying apparatus configured to radiate laser light in a pulse shape to the laser absorption film to form a non-bonding region in which bonding strength between the first substrate and the second substrate is reduced;
a separating apparatus configured to separate the first substrate from the second substrate; and
a control device, and
wherein the control device performs, in the interface modifying apparatus, a control of changing a temperature difference between a first temperature in a laser radiation direct region including one light-converging point of the laser light radiated in the pulse shape and a second temperature in a laser radiation peripheral region formed between the one light-converging point and another light-converging point to which the laser light is radiated after the one light-converging point based on at least one of layer information acquired prior to the formation of the non-bonding region, or a position of the one light-converging point in the combined substrate in a radial direction.

21. The processing system of claim 20,
wherein the control device controls, in the interface modifying apparatus, the radiation of the laser light such that the first substrate is expanded by heat generated as a result of radiating the laser light to the laser absorption film to cause separation at an interface between the first substrate and the laser absorption film due to a stress generated by the expansion of the first substrate.

22. The processing system of claim 21,
wherein the laser light includes multiple laser lights, and
the control device controls, in the interface modifying apparatus, the radiation of the laser light such that the stress is accumulated by radiating the multiple laser lights to the laser absorption film to cause the separation of the first substrate and the laser absorption film due to the accumulated stress.

23. The processing system of claim 22,
wherein the control device controls, in the interface modifying apparatus, the radiation of the laser light such that the separation occurs in different regions at the interface between the first substrate and the laser absorption film, and a separation surface as a starting point of the separation of the first substrate and the laser absorption film is formed by connecting the separation occurred in the different regions.

24. The processing system of claim 23,
wherein the separating apparatus is controlled to separate and remove at least a part of the first substrate from the combined substrate, starting from the separation surface as the starting point.

25. The processing system of claim 20, further comprising:
an internal modifying apparatus configured to form a peripheral modification layer serving as a starting point of separation of a peripheral portion of the first substrate as a removing target along a boundary between the peripheral portion of the first substrate and a central portion of the first substrate,
wherein the control device performs, in the separating apparatus, a control of separating the peripheral portion of the first substrate from the second substrate.

26. The processing system of claim 25,
wherein the control device sets the temperature difference on a radially inner side, which is a side of a position in the peripheral portion where the peripheral modification layer is formed, to be larger than the temperature difference on a radially outer side, which is an end side of the first substrate in the peripheral portion.

27. The processing system of claim 20, wherein the control device performs a control of setting the temperature difference in a region where the first substrate and the second substrate are difficult to separate, the region being detected based on the layer information, to be larger than the temperature difference in a region where the first substrate and the second substrate are normally separated.

28. The processing system of claim 20, wherein a frequency of the laser light radiated to the laser absorption film is allowed to be changed as required, and the control device controls the temperature difference between the laser radiation direct region and the laser radiation peripheral region by changing the frequency of the laser light radiated to the laser absorption film.

29. The processing system of claim 28, wherein the control device performs a control of setting the frequency in a region where the first substrate and the second substrate are difficult to separate, the region being detected based on the layer information, to be smaller than the frequency in a region where the first substrate and the second substrate are normally separated.

30. The processing system of claim 20, wherein the interface modifying apparatus comprises a spatial light modulator configured to branch the laser light into multiple laser lights, and the control device performs a control of setting a position of the one light-converging point of each of the multiple laser lights simultaneously radiated at an interval of at least one laser radiation peripheral region in at least one of the radial direction or a circumferential direction of the combined substrate.

31. The processing system of claim 20, wherein the interface modifying apparatus comprises a spatial light modulator configured to branch the laser light into multiple laser lights, and the control device performs a control of setting a position of the one light-converging point of each of the multiple laser lights simultaneously radiated at an interval in both the radial direction and a circumferential direction of the combined substrate.

32. The processing system of claim 20, wherein the interface modifying apparatus comprises a spatial light modulator configured to branch the laser light into multiple laser lights, and the control device performs a control of changing a shape of the laser light radiated to the laser absorption film based on a position of the one light-converging point in the combined substrate in the radial direction.

33. The processing system of claim 32, wherein the control device controls the laser light to have a trapezoidal shape with a short side on a radially inside of the combined substrate and a long side on a radially outside of the combined substrate.

34. The processing system of claim 20, wherein the interface modifying apparatus comprises:

a substrate holder configured to hold the combined substrate; and a cooling mechanism disposed inside the substrate holder, and wherein the control device controls the temperature difference between the laser radiation direct region and the laser radiation peripheral region by cooling the combined substrate with the cooling mechanism.

35. The processing system of claim 20, wherein the interface modifying apparatus comprises:

a substrate holder configured to hold the combined substrate; and an air nozzle disposed above the substrate holder, and wherein the control device controls the temperature difference between the laser radiation direct region and the laser radiation peripheral region by cooling the combined substrate through a supply of cooling air to the combined substrate from the air nozzle.

36. The processing system of claim 35, wherein the air nozzle is configured as one body with a laser radiator configured to radiate the laser light.

37. The processing system of claim 20, wherein the layer information includes information of at least one of a thickness or a structure of the laser absorption film.

* * * * *